(12) United States Patent
Date

(10) Patent No.: US 10,984,858 B2
(45) Date of Patent: Apr. 20, 2021

(54) SEMICONDUCTOR STORAGE DEVICE

(71) Applicant: Kioxia Corporation, Minato-ku (JP)

(72) Inventor: Hiroki Date, Chigasaki (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/785,752

(22) Filed: Feb. 10, 2020

(65) Prior Publication Data

US 2021/0082499 A1 Mar. 18, 2021

(30) Foreign Application Priority Data

Sep. 17, 2019 (JP) .............................. JP2019-168845

(51) Int. Cl.
| | | |
|---|---|---|
| *G11C 11/56* | (2006.01) | |
| *G11C 16/04* | (2006.01) | |
| *G11C 16/08* | (2006.01) | |
| *G11C 16/26* | (2006.01) | |
| *G11C 16/30* | (2006.01) | |

(52) U.S. Cl.
CPC ...... *G11C 11/5642* (2013.01); *G11C 16/0483* (2013.01); *G11C 16/08* (2013.01); *G11C 16/26* (2013.01); *G11C 16/30* (2013.01)

(58) Field of Classification Search
CPC ............................ G11C 11/5642; G11C 11/56
USPC ..................................................... 365/185.03
See application file for complete search history.

(56) References Cited

U.S. PATENT DOCUMENTS

| | | | |
|---|---|---|---|
| 9,792,996 B1 | 10/2017 | Date | |
| 10,062,441 B1* | 8/2018 | Vali ..................... | G11C 11/5642 |
| 2008/0084761 A1* | 4/2008 | Lee ...................... | G11C 11/5628 |
| | | | 365/185.28 |
| 2011/0286279 A1* | 11/2011 | Lei ...................... | G11C 16/3404 |
| | | | 365/185.19 |
| 2013/0077412 A1* | 3/2013 | Sivero ................ | G11C 16/0483 |
| | | | 365/185.23 |
| 2016/0049192 A1* | 2/2016 | Lee ..................... | G11C 11/5642 |
| | | | 365/185.03 |

FOREIGN PATENT DOCUMENTS

JP    2017-216025 A    12/2017

* cited by examiner

*Primary Examiner* — Muna A Techane
(74) *Attorney, Agent, or Firm* — Oblon, McClelland, Maier & Neustadt, L.L.P.

(57) ABSTRACT

A semiconductor storage device includes: a voltage generation circuit configured to generate a read voltage to be supplied to a selected word line to which a read-target memory cell transistor is connected and a read-pass voltage to be supplied to an adjacent word line; a word line driver configured to, when the read voltage transitions, apply the read voltage to the selected word line with a first kick voltage amount and apply the read-pass voltage to the adjacent word line with a second kick voltage amount; and a control circuit configured to set each of the first kick voltage amount and the second kick voltage amount to a voltage corresponding to an amount of the transition.

9 Claims, 20 Drawing Sheets

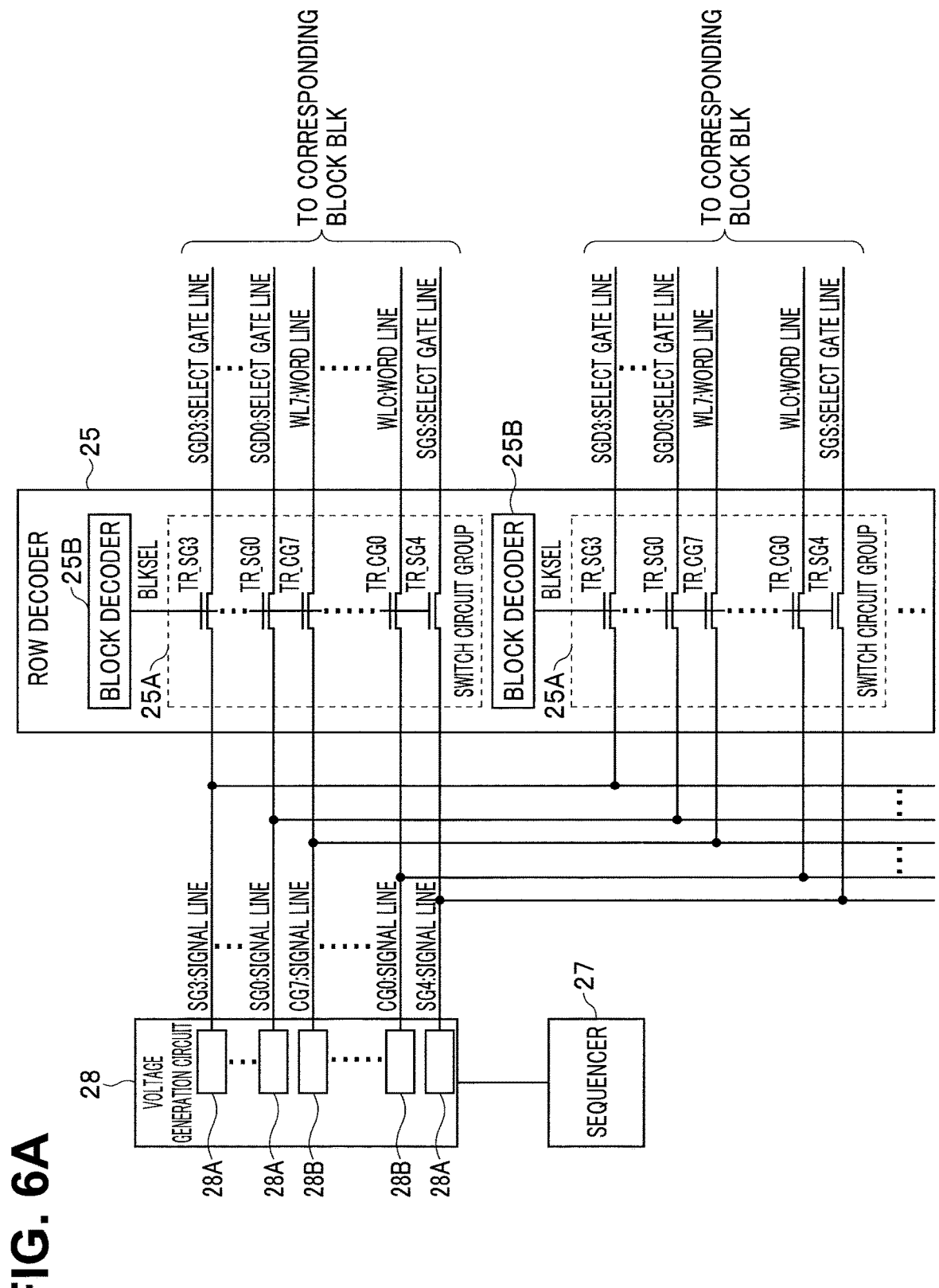

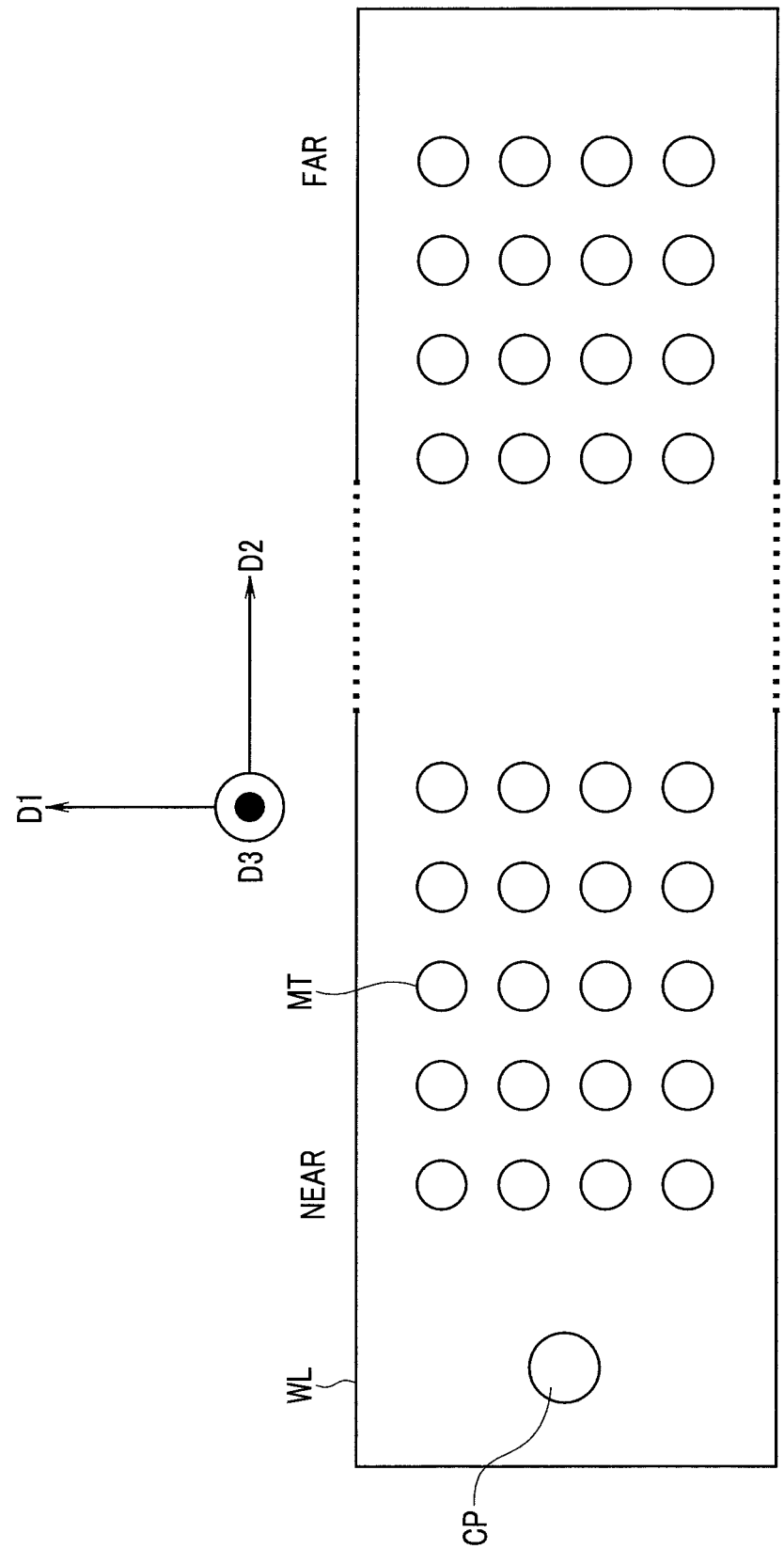

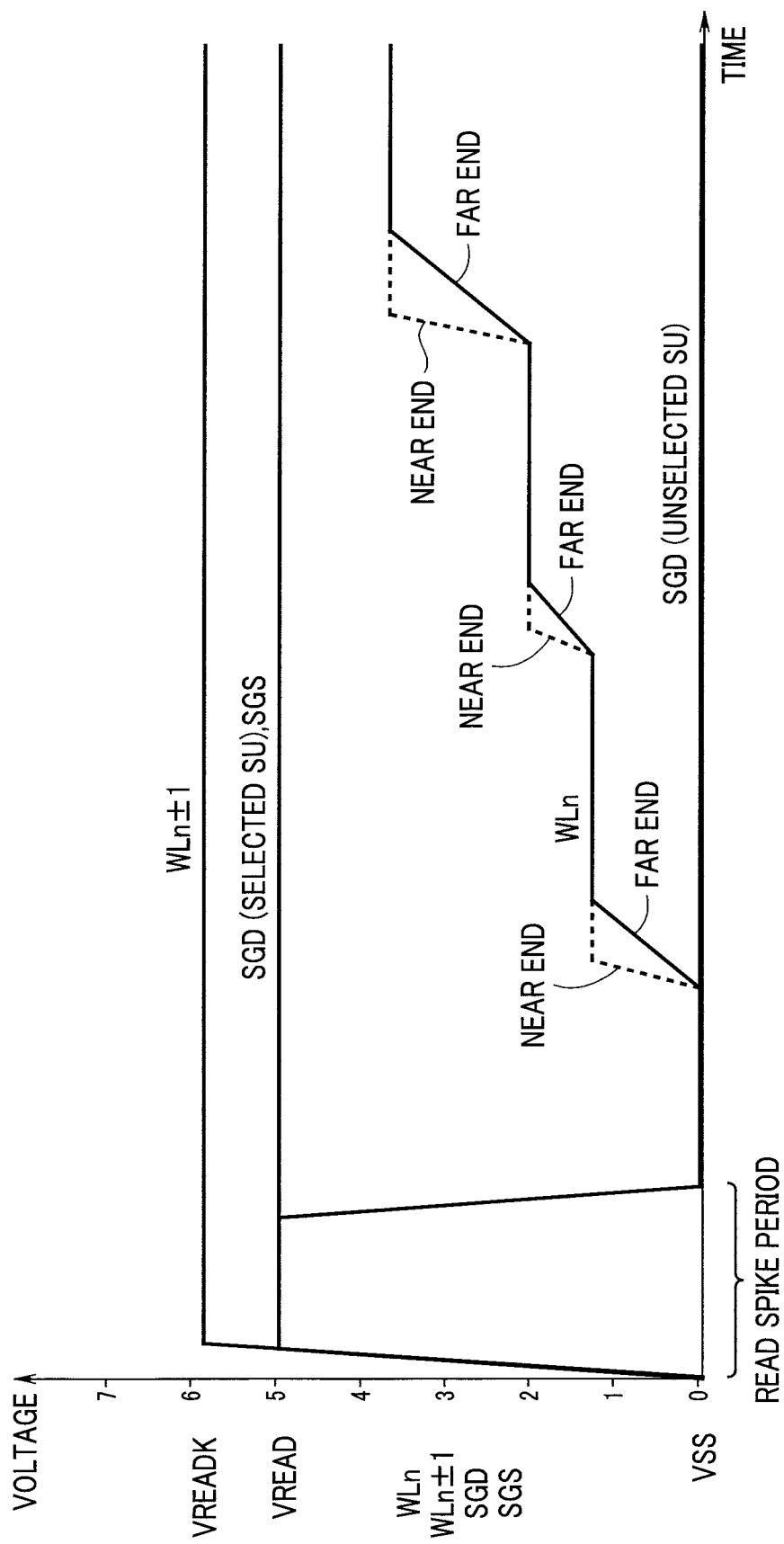

SEMICONDUCTOR STORAGE DEVICE

CROSS-REFERENCE TO RELATED APPLICATION

This application is based upon and claims the benefit of priority from the prior Japanese Patent Application No. 2019-168845 filed in Japan on Sep. 17, 2019; the entire contents of which are incorporated herein by reference.

FIELD

Embodiments described herein relate generally to a semiconductor storage device.

BACKGROUND

Recently, in a semiconductor storage device such as a NAND-type flash memory, a three-dimensional structure has been adopted for refinement and capacity enlargement. As for the NAND-type flash memory, there is not only a case where a memory cell transistor is configured as an SLC (single-level cell) capable of holding 1-bit (binary) data but also a case where the memory cell transistor is configured as an MLC (multi-level cell) capable of holding 2-bit (four-valued) data, a TLC (triple-level cell) capable of holding 3-bit (8-valued) data or a QLC (quad-level cell) capable of holding 4-bit (16-valued) data.

When a memory cell transistor is multi-valued as described above, it is necessary to change a read voltage according to data stored in the memory cell transistor at the time of reading data, and there is a demand for speeding up transition to each read voltage.

BRIEF DESCRIPTION OF THE DRAWINGS

FIG. 6A is a block diagram showing an example of a configuration of a row decoder 25.

FIG. 6C is an explanatory diagram for illustrating a near end and a far end.

FIG. 14A is a waveform diagram showing difference between voltage waveforms at the near end and the far end.

DETAILED DESCRIPTION

Embodiments of the present invention will be described below in detail with reference to drawings.

First Embodiment

The present embodiment makes it possible to, when causing a voltage applied to a word line to which write-target memory cell transistors are connected (hereinafter referred to as a selected word line) to transition, set the selected word line to a desired voltage at a high speed, by giving a kick (hereinafter referred to as a selected word line kick) to the applied voltage to shorten a setup time period and giving a kick to the selected word line (hereinafter referred to as an adjacent word line kick) according to the amount of transition of the applied voltage to word lines adjacent to the selected word line (hereinafter referred to as adjacent word lines) in a direction opposite to a positive/negative direction of the selected word line.

(Configuration of Memory System)

Figure 1:
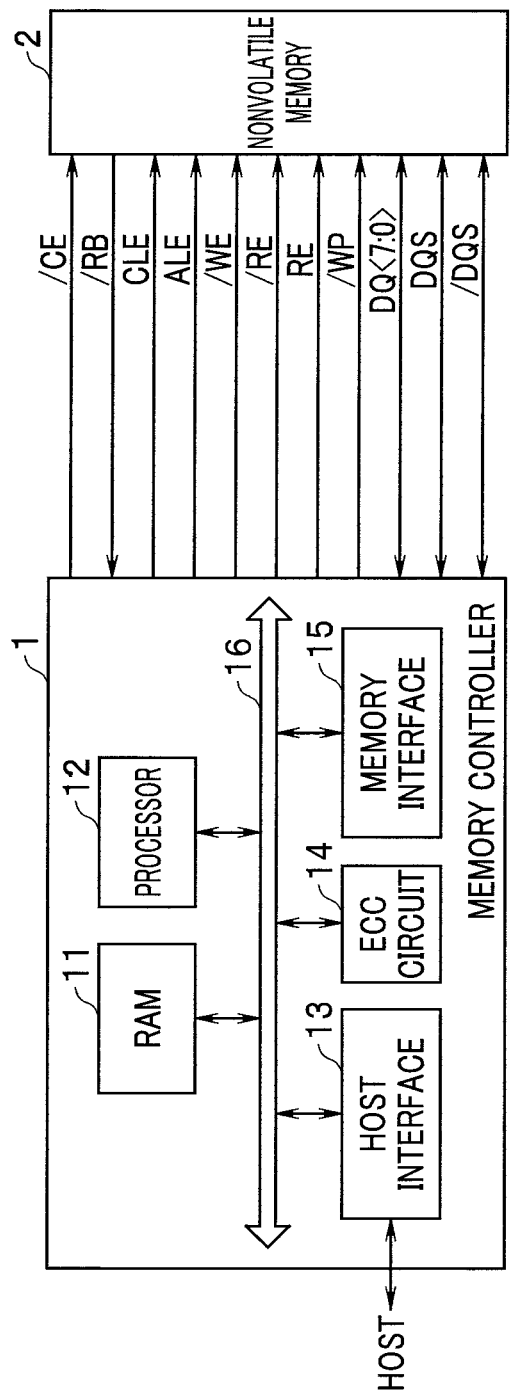
FIG. 1 is a block diagram showing a configuration example of a memory system according to an embodiment.

FIG. 1 is a block diagram showing a configuration example of a memory system according to the embodiment. The memory system of the present embodiment is provided with a memory controller 1 and a nonvolatile memory 2. The memory system is connectable to a host. The host is an electronic apparatus, for example, a personal computer or a mobile terminal.

The nonvolatile memory 2 is a semiconductor storage device configured to nonvolatilely store data and is provided, for example, with a NAND flash memory. In the present embodiment, the nonvolatile memory 2 is described as a NAND memory having memory cell transistors each of which is capable of storing 3 bits, that is, as a 3-bit/cell (TLC: triple-level cell) NAND memory. However, the nonvolatile memory 2 is not limited to the 3-bit/cell NAND memory. The nonvolatile memory 2 is three-dimensionally structured.

The memory controller 1 controls writing of data to the nonvolatile memory 2 according to a write request from the host. Further, the memory controller 1 controls reading of data from the nonvolatile memory 2 according to a read request from the host. The memory controller 1 is provided with RAM (random access memory) 11, a processor 12, a host interface 13, an ECC (error check and correct) circuit 14 and a memory interface 15. The RAM 11, the processor 12, the host interface 13, the ECC circuit 14 and the memory interface 15 are mutually connected via an internal bus 16.

The host interface 13 outputs a request received from the host, write data which is user data, and the like to the internal bus 16. Further, the host interface 13 transmits user data read from the nonvolatile memory 2, a response from the processor 12 and the like to the host.

The memory interface 15 controls processing for writing user data or the like to the nonvolatile memory 2 and processing for reading user data or the like from the nonvolatile memory 2 based on an instruction of the processor 12.

The processor 12 performs overall control of the memory controller 1. The processor 12 is, for example, a CPU (central processing unit), an MPU (micro processing unit) or the like. If receiving a request from the host via the host interface 13, the processor 12 performs control according to the request. For example, the processor 12 instructs the memory interface 15 to write user data and parity to the nonvolatile memory 2 according to a request from the host. Further, the processor 12 instructs the memory interface 15 to read user data and parity from the nonvolatile memory 2 according to a request from the host.

The processor 12 determines a storage area on the nonvolatile memory 2 (hereinafter referred to as a memory area) for user data accumulated in the RAM 11. User data is stored into the RAM 11 via the internal bus 16. The processor 12 performs determination of a memory area for data per page which is a write unit, that is, for page data. In the present specification, user data stored in one page of the nonvolatile memory 2 is defined as unit data. The unit data is, for example, encoded and stored into the nonvolatile memory 2 as a codeword.

Note that encoding is not necessarily required. Though the memory controller 1 may store unit data into the nonvolatile memory 2 without encoding the unit data, FIG. 1 shows a configuration in which encoding is performed, as one configuration example. When the memory controller 1 does not perform encoding, page data corresponds to unit data. One codeword may be generated based on one piece of unit data, or one codeword may be generated based on divided pieces of data obtained by dividing unit data. Further, one codeword may be generated using a plurality of pieces of unit data.

The processor 12 determines a write-destination memory area on the nonvolatile memory 2 for each piece of unit data. Physical addresses are assigned to memory areas on the nonvolatile memory 2. The processor 12 manages a write-destination memory area for unit data using a physical address. The processor 12 instructs the memory interface 15 to write user data into the nonvolatile memory 2, specifying a physical address of the determined memory area. The processor 12 manages correspondence between a logical address (a logical address managed by the host) and a physical address for user data. If receiving a read request including a logical address from the host, the processor 12 identifies a physical address corresponding to the logical address and instructs the memory interface 15 to read user data, specifying the physical address.

The ECC circuit 14 encodes user data stored in the RAM 11 to generate a codeword. Further, the ECC circuit 14 decodes a codeword read from the nonvolatile memory 2.

The RAM 11 temporarily stores user data received from the host until the user data is stored into the nonvolatile memory 2 or temporarily stores data read from the nonvolatile memory 2 until the data is transmitted to the host. The RAM 11 is a general-purpose memory, for example, SRAM (static random access memory) or DRAM (dynamic random access memory).

FIG. 1 shows a configuration example in which the memory controller 1 is provided with each of the ECC circuit 14 and the memory interface 15. However, the ECC circuit 14 may be built in the memory interface 15. The ECC circuit 14 may be built in the nonvolatile memory 2.

If receiving a write request from the host, the memory controller 1 operates as below. The processor 12 causes write data to be temporarily stored in the RAM 11. The processor 12 reads the data stored in the RAM 11 and inputs the data to the ECC circuit 14. The ECC circuit 14 encodes the inputted data and gives the codeword to the memory interface 15. The memory interface 15 writes the inputted codeword to the nonvolatile memory 2.

If receiving a read request from the host, the memory controller 1 operates as below. The memory interface 15 gives a codeword read from the nonvolatile memory 2 to the ECC circuit 14. The ECC circuit 14 decodes the inputted codeword and stores the decoded data into the RANI 11. The processor 12 transmits the data stored into the RAM 11 to the host via the host interface 13.

(Configuration of Nonvolatile Memory)

Figure 2:
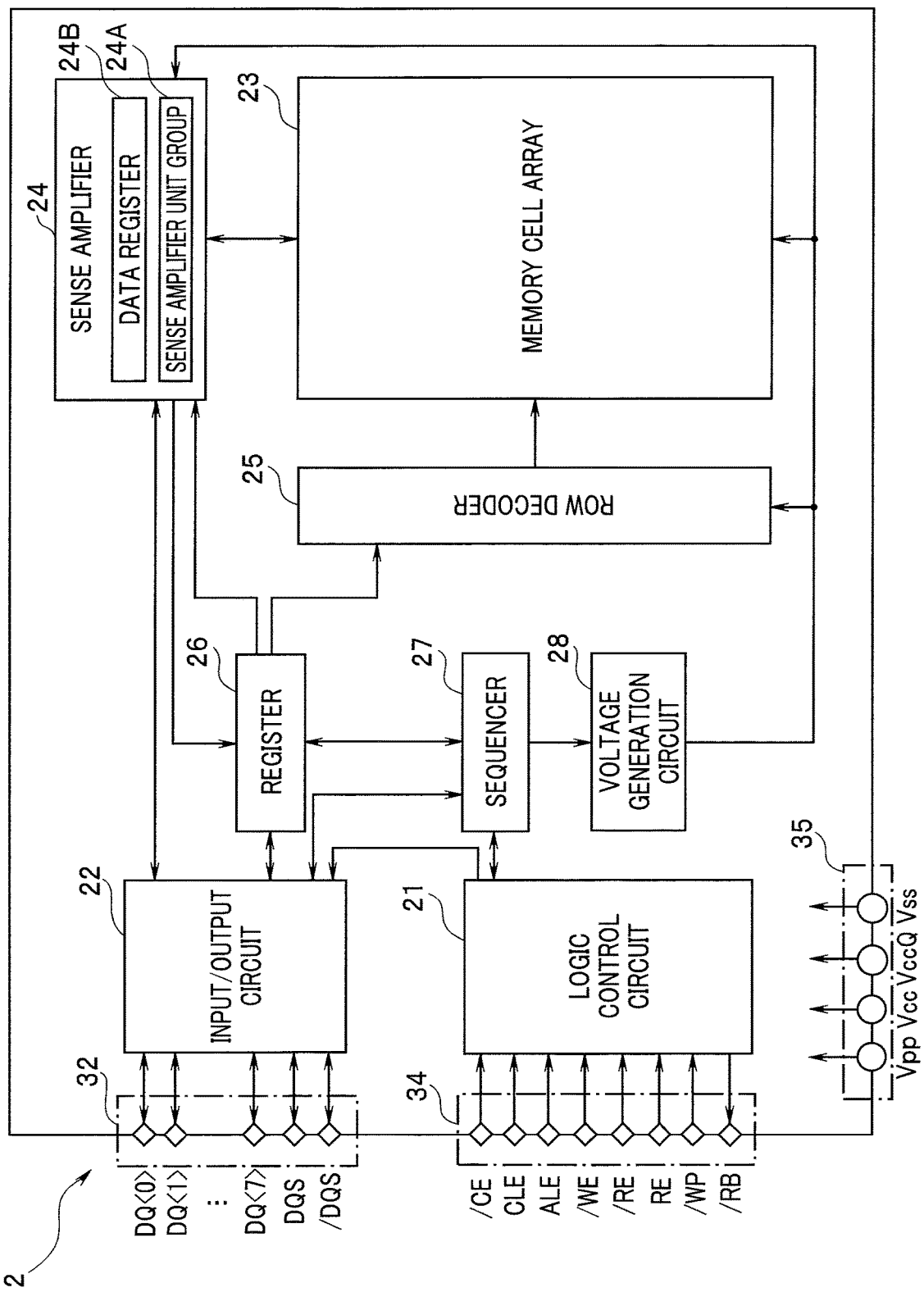
FIG. 2 is a block diagram showing a configuration example of a nonvolatile memory of the present embodiment.

FIG. 2 is a block diagram showing a configuration example of a nonvolatile memory of the present embodiment. The nonvolatile memory 2 is provided with a logic control circuit 21, an input/output circuit 22, a memory cell array 23, a sense amplifier 24, a row decoder 25, a register 26, a sequencer 27, a voltage generation circuit 28, a pad group for input/output 32, a pad group for logic control 34 and a terminal group for power supply input 35.

The memory cell array 23 is provided with a plurality of blocks. Each of the plurality of blocks BLK is provided with a plurality of memory cell transistors (memory cells). On the memory cell array 23, a plurality of bit lines, a plurality of word lines, a source line and the like are disposed to control a voltage applied to the memory cell transistors. A specific configuration of the block BLK will be described later.

The pad group for input/output 32 is provided with a plurality of terminals (pads) corresponding with the memory controller 1 to a signal DQ<7:0> and data strobe signals DQS and /DQS to perform transmission/reception of each signal including data.

The pad group for logic control 34 is provided with a plurality of terminals (pads) corresponding with the memory controller 1 to a chip enable signal /CE, a command latch enable signal CLE, an address latch enable signal ALE, a write enable signal /WE, read enable signals RE and /RE and a write protect signal /WP to perform transmission/reception of each signal.

The signal /CE enables selection of the nonvolatile memory 2. The signal CLE makes it possible to latch a command transmitted as a signal DQ to a command register. The signal ALE makes it possible to latch an address transmitted as a signal DQ to an address register. The signal WE enables writing. The signal RE enables reading. The signal WP inhibits writing and erasure. The signal R/B shows whether the nonvolatile memory 2 is in a ready state (a state capable of receiving a command from outside) or in a busy state (a state not capable of receiving a command from outside). The memory controller 1 can know the state of the nonvolatile memory 2 by receiving the signal R/B.

The terminal group for power supply input 35 is provided with a plurality of terminals configured to input power supply voltages Vcc, VccQ and Vpp and a ground voltage Vss to supply various kinds of operation power supply to the nonvolatile memory 2 from outside. The power supply voltage Vcc is generally a circuit power supply voltage given from outside as operation power supply, and, for example, a voltage of about 3.3 V is inputted. As for the power supply voltage VccQ, for example, a voltage of 1.2 V is inputted. The power supply voltage VccQ is used when a signal is transmitted/received between the memory controller 1 and the nonvolatile memory 2. The power supply voltage Vpp is a power supply voltage higher than the power supply voltage Vcc, and, for example, a voltage of 12 V is inputted.

The logic control circuit 21 and the input/output circuit 22 are connected to the memory controller 1 via a NAND bus. The input/output circuit 22 transmits/receives signals DQ (for example, DQ0 to DQ7) to/from the memory controller 1 via the NAND bus.

The logic control circuit 21 receives an external control signal (for example, the chip enable signal /CE, the command latch enable signal CLE, the address latch enable signal ALE, the write enable signal /WE, the read enable signal RE or /RE or the write protect signal /WP) from the memory controller 1 via the NAND bus. Here, "/" attached to the signal names indicates an active row. Further, the logic control circuit 21 transmits a ready/busy signal /RB to the memory controller 1 via the NAND bus.

The register 26 is provided with a command register, an address register, a status register and the like. The command resistor temporarily holds a command. The address resistor temporarily holds an address. The status register temporarily holds data required for an operation of the nonvolatile memory 2. The register 26 is configured, for example, with an SRAM.

The sequencer 27 receives a command from the register 26, and controls the nonvolatile memory 2 according to a sequence based on the command.

The voltage generation circuit 28 receives a power supply voltage from the outside of the nonvolatile memory 2, and generates a plurality of voltages required for a write operation, a read operation and an erase operation using the power supply voltage. The voltage generation circuit 28 supplies the generated voltages to the memory cell array 23, the sense amplifier 24, the row decoder 25 and the like.

The row decoder 25 receives a row address from the register 26 and decodes the row address. The row decoder 25 performs a word line selection operation based on the decoded row address. Then, the row decoder 25 transfers to a selected block the plurality of voltages required for a write operation, a read operation and an erase operation.

The sense amplifier 24 receives a column address from the register 26 and decodes the column address. The sense amplifier 24 selects any of the bit lines based on the decoded column address. At the time of reading data, the sense amplifier 24 detects and amplifies the data read onto the bit line from memory cell transistors. Further, at the time of writing data, the sense amplifier 24 transfers write data to the bit line.

The sense amplifier 24 has a data register 24B. At the time of reading data, the data register 24B temporarily holds the data detected by the sense amplifier 24 and serially transfers the data to the input/output circuit 22. At the time of writing data, the data register 24B temporarily holds the data serially transferred from the input/output circuit 22 and transfers the data to the sense amplifier 24. The data register 24B is configured with an SRAM or the like.

(Block Configuration of Memory Cell Array)

Figure 3:
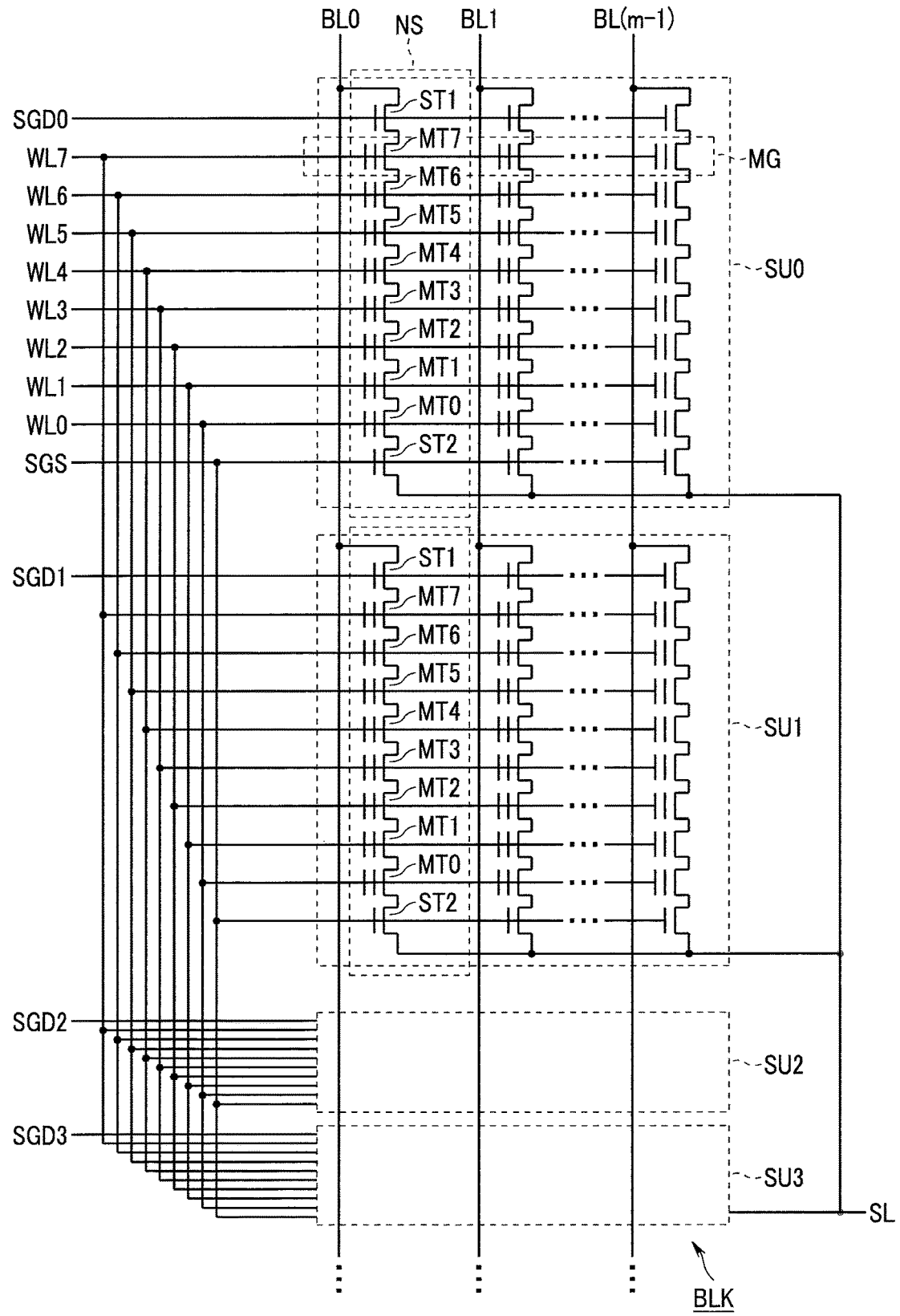
FIG. 3 is a diagram showing a configuration example of a block of a NAND memory cell array (hereinafter referred to as a memory cell array) 23 in a three-dimensional structure.

FIG. 3 is a diagram showing a configuration example of a block of the NAND memory cell array 23 in a three-dimensional structure. FIG. 3 shows one block BLK among the plurality of blocks constituting the memory cell array 23. Each of the other blocks of the memory cell array also has a configuration similar to FIG. 3. Note that the present embodiment is applicable to a memory cell array in a two-dimensional structure.

As shown in FIG. 3, the block BLK includes, for example, four string units (SU0 to SU3). Each of the string units SU includes a plurality of NAND strings NS. Here, each of the NAND strings NS includes eight memory cell transistors MT (MT0 to MT7) and select gate transistors ST1 and ST2. Note that though the number of memory cell transistors MT included in each of the NAND strings NS is eight here, the number is not limited to eight but may be, for example, thirty-two, forty-eight, sixty-four, ninety-six or the like. Each of the select gate transistors ST1 and ST2 is shown as one transistor from a viewpoint of an electrical circuit but may be the same as a memory cell transistor from a viewpoint of a structure. Further, for example, in order to enhance a cut-off characteristic, a plurality of select gate transistors may be used as each of the select gate transistors ST1 and ST2. Furthermore, a dummy cell transistor may be provided between the memory cell transistors MT and each of the select gate transistors ST1 and ST2.

The memory cell transistors MT are arranged so as to be connected in series between the select gate transistors ST1 and ST2. The memory cell transistor MT7 on one end side is connected to the select gate transistor ST1, and the memory cell transistor MT0 on the other end side is connected to the select gate transistor ST2.

Gates of the select gate transistors ST1 of the string units SU0 to SU3 are connected to select gate lines SGD0 to SGD3. Gates of the select gate transistors ST2 are connected to the same select gate line SGS in common among the plurality of string units SU existing in the same block BLK. Gates of the memory cell transistors MT0 to MT7 existing in the same block BLK are connected to word lines WL0 to WL7 in common, respectively. In other words, the word lines WL0 to WL7 and the select gate line SGS are connected in common among the plurality of string units SU0 to SU3 in the same block BLK, while the select gate lines SGD for the string units SU0 to SU3 are respectively independent even in the same block BLK.

The word lines WL0 to WL7 are connected to the gates of the memory cell transistors MT0 to MT7 constituting each NAND string NS, respectively. Gates of memory cell transistors MTi on the same row in each block BLK are connected to the same word line WLi. In the description below, the NAND string NS may be referred to simply as a "string".

Each NAND string NS is connected to a corresponding bit line. Therefore, each memory cell transistor MT is connected to the bit line via the select gate transistors ST and the other memory cell transistors MT included in the NAND string NS. As described above, data in memory cell transistors MT existing in the same block BLK is collectively erased. On the other hand, reading and writing of data is performed per memory cell group MG (or per page). In the present specification, a plurality of memory cell transistors MT connected to one word line WLi and belonging to one string unit SU are defined as a memory cell group MG. In the present embodiment, the nonvolatile memory 2 is a TLC NAND memory capable of holding 3-bit (8-valued) data. Therefore, one memory cell group MG can hold data corresponding to three pages. Three bits that each memory cell transistor MT can hold corresponds to the three pages.

Figure 4:
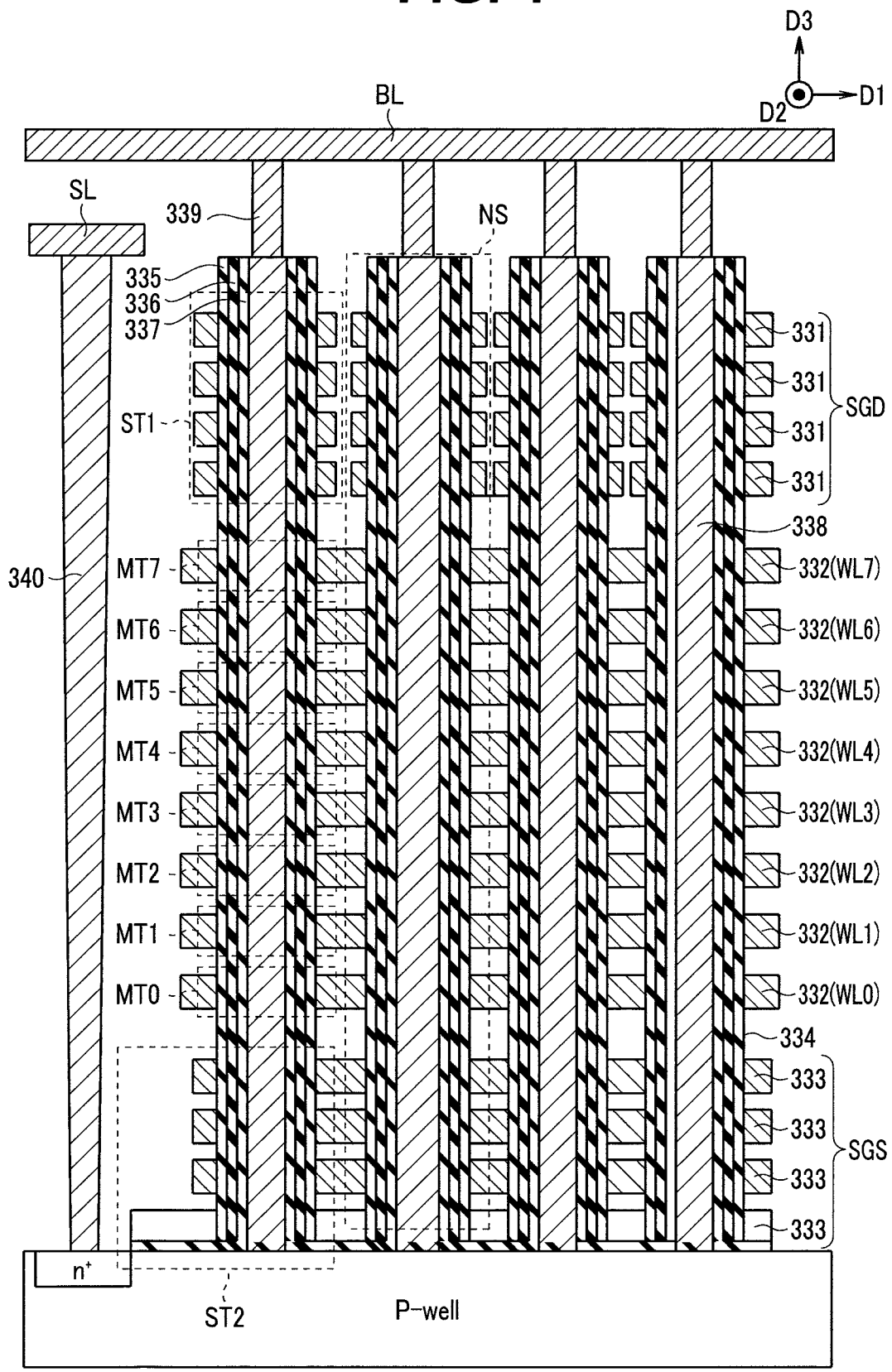
FIG. 4 is a cross-sectional view of a partial area of the NAND memory cell array in the three-dimensional structure.

FIG. 4 is a cross-sectional view of a partial area of the NAND memory cell array in the three-dimensional structure. As shown in FIG. 4, a plurality of NAND strings NS are formed on a p-type well area (P-well) (in a D3 direction). In other words, on the p-type well area, a plurality of wiring layers 333 that function as select gate lines SGS, a plurality of wiring layers 332 that function as word lines WLi and a plurality of wiring layers 331 that function as select gate lines SGD are laminated.

Memory holes 334 that reach the p-type well area through the wiring layers 333, 332 and 331 are formed. On a side face of each of the memory holes 334, a block insulating film 335, a charge accumulating film (a charge holding area) 336 and a gate insulating film 337 are sequentially formed. Furthermore, electric conductor columns 338 are embedded in the memory holes 334. The electric conductor columns 338 are made, for example, of polysilicon. The electric conductor columns 338 function as areas where channels are formed when the memory cell transistors MT and the select gate transistors ST1 and ST2 included in the NAND strings NS operate. In other words, the wiring layers 331, the electric conductor columns 338 and the films 335 to 337 between the wiring layers 331 and the electric conductor columns 338 function as the select gate transistors ST1; the wiring layers 332, the electric conductor columns 338 and the films 335 to 337 between the wiring layers 332 and the electric conductor columns 338 function as the memory cell transistors MT; and the wiring layers 333, the electric conductor columns 338 and the films 335 to 337 between the wiring layers 333 and the electric conductor columns 338 function as the select gate transistors ST2.

Note that though each memory hole 334 and each electric conductor column 338 are shown as being in a cylindrical shape with the same diameter in FIG. 4, the memory hole 334 and the electric conductor column 338 have actually such a tapered shape that the diameter decreases toward the p-type well area. Depending on a manufacturing process, the memory hole 334 and the electric conductor column 338 may have such a multi-staged tapered shape that the diameter decreases taperingly toward the p-type well area with a stepwise-increase midway.

In each NAND string NS, the select gate transistor ST2, the plurality of memory cell transistors MT and the select gate transistor ST1 are formed on the p-type well area in that order. On an upper side of the electric conductor column 338 (in the D3 direction), a wiring layer that functions as a bit line BL is formed. On an upper end of the electric conductor column 338, a contact plug 339 configured to connect the electric conductor column 338 and the bit line BL is formed.

Furthermore, under the surface of the p-type well area, an n+ type impurity diffusion layer and a p+ type impurity diffusion layer are formed. A contact plug 340 is formed on the n+ type impurity diffusion layer, and a wiring layer that functions as a source line SL is formed on the contact plug 340.

A plurality of configurations, each of which is the configuration shown in FIG. 4 and described above, are arrayed in a depth direction of the paper (a D2 direction) in FIG. 4, and one string unit SU is formed with a set of a plurality of NAND strings lined up in a row in the depth direction.

(Sense Amplifier)

Figure 5:
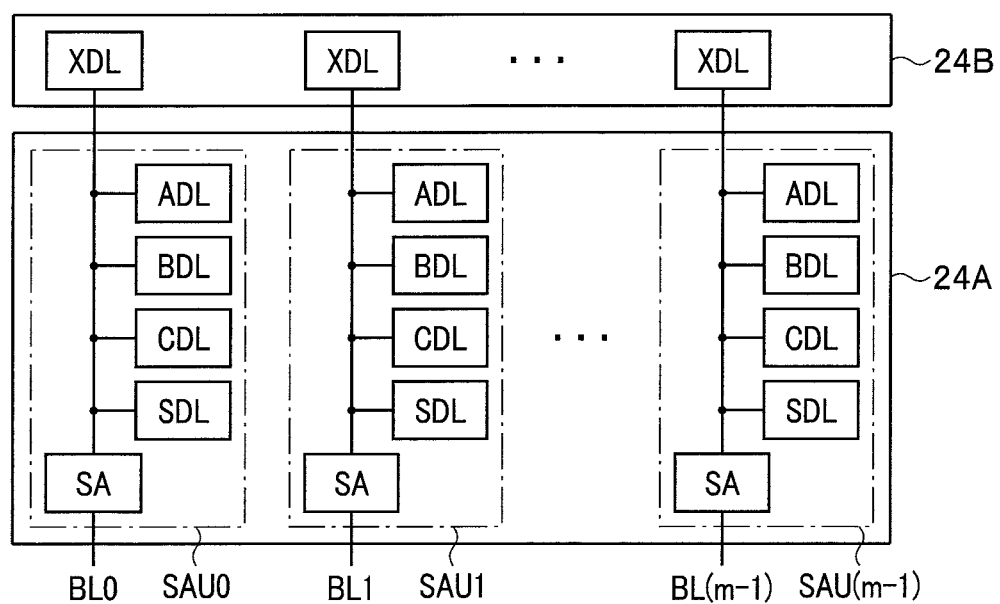
FIG. 5 is a block diagram showing an example of a configuration of a sense amplifier 24.

FIG. 5 is a block diagram showing an example of the sense amplifier 24 in FIG. 2.

The sense amplifier 24 has a sense amplifier unit group 24A and the data register 24B. The sense amplifier unit group 24A includes sense amplifier units SAU0 to SAU(m−1) corresponding to bit lines BL0 to BL(m−1). Each sense amplifier unit SAU is provided with a sense amplifier portion SA and data latch circuits SDL, ADL, BDL and CDL. The sense amplifier portion SA and the data latch circuits SDL, ADL, BDL and CDL are mutually connected so as to be capable of mutually transferring data.

The data latch circuits SDL, ADL, BDL and CDL temporarily hold data. At the time of a write operation, the sense amplifier portion SA controls the voltage of the bit line BL according to the data held by the data latch circuits SDL. The data latch circuits ADL, BDL and CDL are used for a multi-value operation in which each memory cell transistor MT holds data of two bits or more. In other words, the data latch circuit ADL is used to hold a lower page. The data latch circuit BDL is used to hold a middle page. The data latch circuit CDL is used to hold an upper page. The number of data latch circuits provided in the sense amplifier unit SAU is arbitrarily changeable according to the number of bits one memory cell transistor MT holds.

At the time of a read operation, the sense amplifier portion SA detects data read onto a corresponding bit line BL and determines whether the data is "0" data or "1" data. At the time of a write operation, the sense amplifier portion SA applies a voltage to the bit line BL based on write data.

A data register 29 is provided with data latch circuits XDL the number of which corresponds to the number of the sense amplifier units SAU0 to SAU(m−1). The data latch circuits XDL are connected to the input/output circuit 22. The data latch circuits XDL temporarily hold write data sent from the input/output circuit 22, and temporarily hold read data sent from the sense amplifier units SAU. More specifically, data transfer between the input/output circuit 22 and the sense amplifier units SAU0 to SAU(m−1) is performed via data latch circuits XDL corresponding to one page. The write data received by the input/output circuit 22 is transferred to any of the data latch circuits ADL, BDL and CDL via data latch circuits XDL. The read data read by the sense amplifier portion SA is transferred to the input/output circuit 22 via data latch circuits XDL.

(Row Decoder)

Figure 6B:
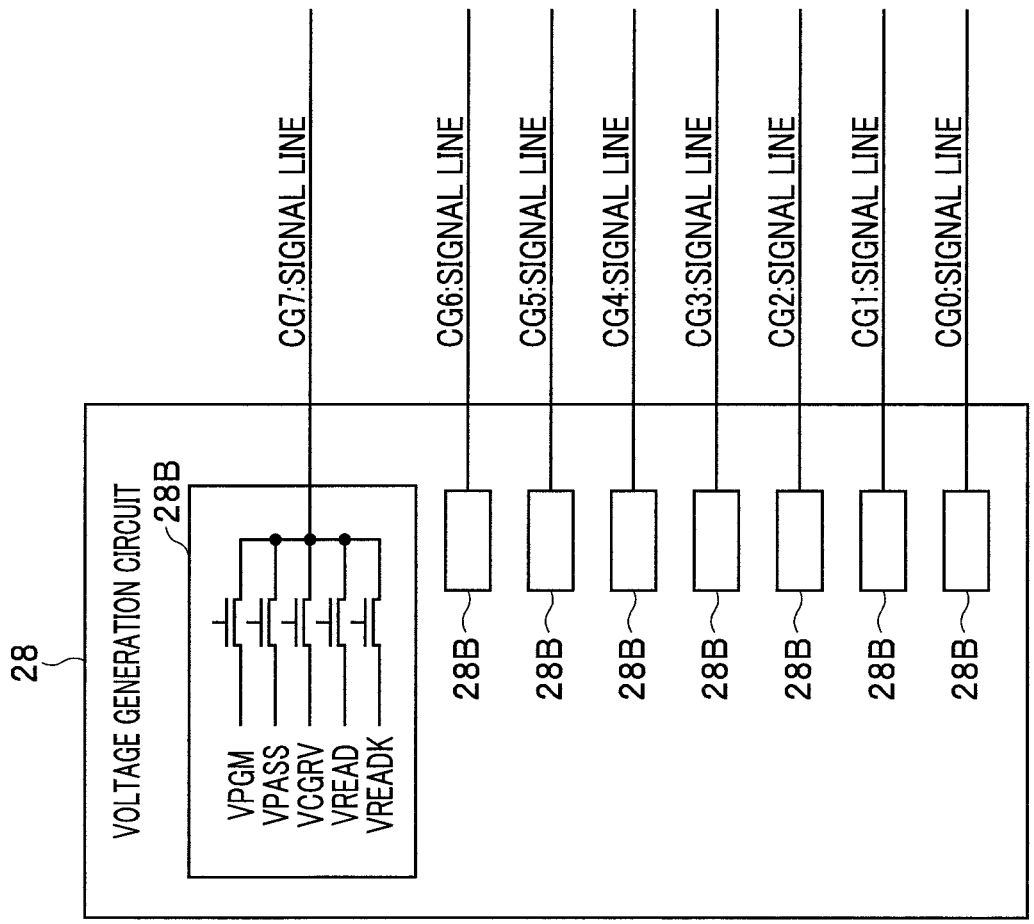
FIG. 6B is a block diagram showing an example of a configuration of a CG driver 28B.

FIG. 6A is a block diagram showing an example of a configuration of the row decoder 25; and FIG. 6B is a block diagram showing an example of a configuration of a CG driver 28B.

The voltage generation circuit 28 includes a plurality of SG drivers 28A configured to supply voltages to signal lines SG0 to SG4, respectively, and a plurality of CG drivers 28B configured to supply voltages to signal lines CG0 to CG7, respectively. The signal lines SG0 to SG4, and CG0 to CG7 are branched by the row decoder 25 and connected to wires of each block BLK. In other words, the signal lines SG0 to SG3 function as global drain side select gate lines and are connected via the row decoder 25 to the select gate lines SGD0 to SGD3 as local select gate lines in each block BLK. The signal lines CG0 to CG7 function as global word lines and are connected via the row decoder 25 to the word lines WL0 to WL7 as local word lines in each block BLK. The signal line SG4 functions as a global source side select gate line and is connected via the row decoder 25 to the select gate line SGS as a local sect gate line in each block BLK.

The voltage generation circuit 28 is controlled by the sequencer 27 to generate various kinds of voltages. The SG drivers (select gate line drivers) 28A and the CG drivers (word line drivers) 28B supply the generated various kinds of voltages to the corresponding signal lines SG0 to SG4 and signal lines CG0 to CG7, respectively. For example, as shown in FIG. 6B, each CG driver 28B selects and supplies any of a voltage VCGRV, a voltage VREAD and a voltage VREADK according to a corresponding signal line CG and a corresponding word line WL, according to an operation target (a row address) in a read operation. A CG driver 28B connected to a signal line CG corresponding to a word line WLn to be an operation target supplies the voltage VCGRV. A CG driver 28B connected to a signal line CGn±1 corresponding to a word line WLn±1 adjacent to the word line WLn to be an operation target supplies the voltage VREADK. Other CG drivers 28B connected to signal lines CGn±2, CGn±3 and the like corresponding to word lines WLn±2, WLn±3 and the like supply the voltage VREAD. The voltage VCGRV functions as a read voltage. The voltage VREADK functions as a first read-pass voltage. The voltage VREAD functions as a second read-pass voltage.

The row decoder 25 has a plurality of switch circuit groups 25A corresponding to the blocks, respectively, and a plurality of block decoders 25B provided corresponding to the plurality of switch circuit groups 25A, respectively. Each switch circuit group 25A includes a plurality of transistors TR_SG0 to TR_SG3 connecting the signal lines SG0 to SG3 and the select gate lines SGD0 to SGD3, respectively, a plurality of transistors TR_CG0 to TR_CG7 connecting the signal lines CG0 to CG7 and the word lines WL0 to WL7, respectively, and a transistor TR_SG4 connecting the signal line SG4 and the select gate line SGS. Each of the transistors TR_SG0 to TR_SG4 and the transistors TR_CG0 to TR_CG7 is a high voltage resistive transistor.

Each block decoder 25B supplies a block select signal BLKSEL to gates of the transistors TR_SG0 to TR_SG4 and the transistors TR_CG0 to TR_CG7 when the block decoder 25B is specified by a row address. Thereby, in a switch circuit group 25A to which the block select signal BLKSEL is supplied from the block decoder 25B specified by the row address, the transistors TR_SG0 to TR_SG4 and the transistors TR_CG0 to TR_CG7 are turned on and electrically connected. Therefore, voltages supplied from the voltage generation circuit 28 to the signal lines SG0 to SG4 and the signal lines CG0 to CG7 is supplied to the select gate lines SGD0 to SGD3, SGS and the word lines WL0 to WL7 included in an operation-target block BLK.

In other words, by the voltage generation circuit 28 and the row decoder 25, the read voltage VCGRV is supplied to a selected word line WLn, the voltage VREADK is supplied to adjacent word lines WLn±1, and the voltage VREAD is supplied to other unselected word lines WLn±2, WLn±3 and the like. For example, a voltage VSG1 is supplied to select gate lines SGD (SGDsel) connected to a select gate transistor ST1 belonging to an operation-target string unit SU; a voltage VSG2 is supplied to select gate lines SGD (SGDusel) connected to select gate transistors ST1 not belonging to the operation-target string unit SU; and a voltage VSG3 is supplied to select gate lines SGS collectively connected to a select gate transistor ST2 in each block BLK.

(Write Operation)

Figure 7:
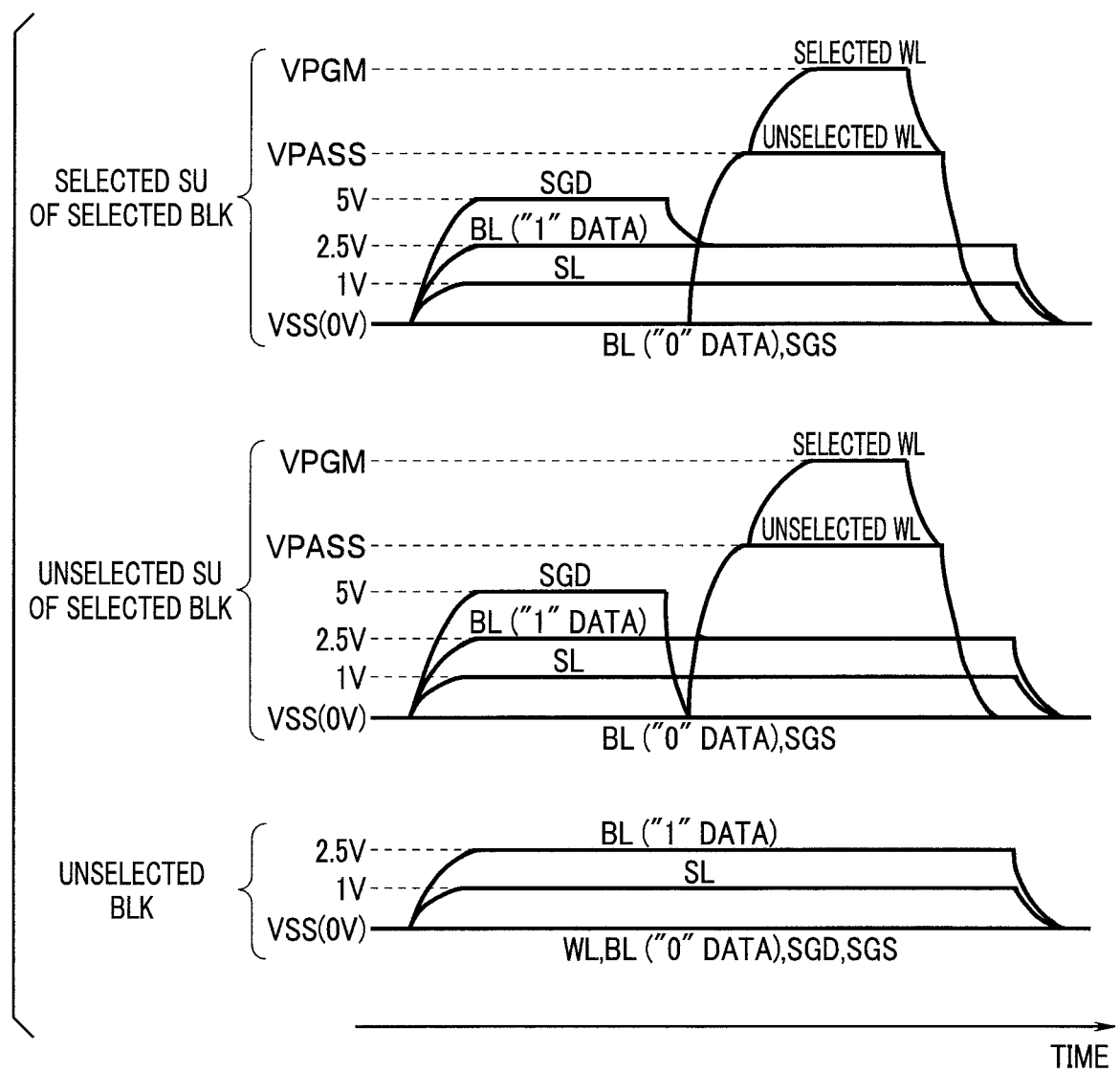
FIG. 7 is a diagram showing potential change of each wire at the time of a write operation.

A write operation includes a program operation of applying a program voltage to increase threshold voltages for memory cell transistors, and a verify operation of, after the program operation, determining whether the threshold voltages for the memory cell transistors have reached a target area by reading data. The verify operation is a read operation performed as a part of the write operation. FIG. 7 is a diagram showing potential change of each wire in the write operation (the program operation). Note that each voltage shown in FIG. 7 is generated by the voltage generation circuit 28 controlled by the sequencer 27.

The program operation is performed according to a program voltage and a bit line voltage applied to word lines and a bit line. A block BLK for which the voltage is not applied to word lines (a selected WL and unselected WL in FIG. 7) is an unselected BLK which is not a write target (a lower part of FIG. 7). Since the bit line voltage is applied to memory cell transistors MT by a select gate transistor ST1 connected to a bit line BL being electrically connected, a string unit SU for which selection is not performed by a select gate line SGD is an unselected SU which is not a write target in a write-target block BLK (a selected BLK) (a middle part of FIG. 7). Note that for the unselected SU in the selected BLK (the middle part of FIG. 7), the select gate transistor ST1 may be electrically connected, for example, by setting the select gate line SGD to 5 V before application of a program voltage VPGM.

As for a write-target string unit SU (a selected SU) in the write-target block BLK (the selected BLK) (an upper part of FIG. 7), the select gate transistor ST1 is electrically connected, for example, by setting the select gate line SGD to 5 V as shown on the left side of the upper part of FIG. 7, before application of the program voltage VPGM. At the time of the program operation, the select gate line SGS is, for example, 0 V. Therefore, the select gate transistor ST2 is in an off state. In comparison, at the time of applying the program voltage VPGM shown on the right side of the upper part of FIG. 7, the select gate line SGD is set, for example, to 2.5 V. Thereby, electrically connected/disconnected states of the select gate transistor ST1 is determined by the bit line voltage of the bit line BL connected to the select gate transistor ST1.

As described above, the sense amplifier 24 transfers data to each bit line BL. To a bit line BL to which "0" data has been given, a ground voltage Vss of, for example, 0 V is applied as a bit line voltage Vbl_L. To a bit line BL to which "1" data has been given, a write inhibit voltage Vinhibit (for example, 2.5 V) is applied as a bit line voltage Vbl_H. Therefore, when the program voltage VPGM is applied, a select gate transistor ST1 connected to a bit line BL to which "0" data has been given is electrically connected, and a select gate transistor ST1 connected to a bit line BL to which "1" data has been given is cut off. Memory cell transistors MT connected to the cut-off select gate transistor ST1 is write-inhibited.

For memory cell transistors MT connected to the select gate transistor ST1 in the electrically connected state, injection of electrons into a charge accumulating film is performed according to voltages applied to the word lines WL. Memory cell transistors MT connected to a word line WL to which a voltage VPASS has been given as a word line voltage enter an electrically connected state irrespective of the threshold voltages, but injection of electrons into the charge accumulating film is not performed. On the other hand, for memory cell transistors MT connected to a word line WL to which the program voltage VPGM has been given as a word line voltage, injection of electrons into the charge accumulating film is performed according to the program voltage VPGM.

In other words, the row decoder 25 selects any of word lines WL in a selected block BLK, applies the program voltage VPGM to the selected word line and applies the voltage VPASS to other word lines (unselected word lines) WL. The program voltage VPGM is a high voltage for injecting electrons into a charge accumulation film by a tunnel phenomenon and VPGM>VPASS. By supplying data to each bit line BL by the sense amplifier 24 while controlling the voltages of the word lines WL by the row decoder

25, an operation of writing to each memory cell transistor MT of the memory cell array 23 (the program operation) is performed.

Figure 8:
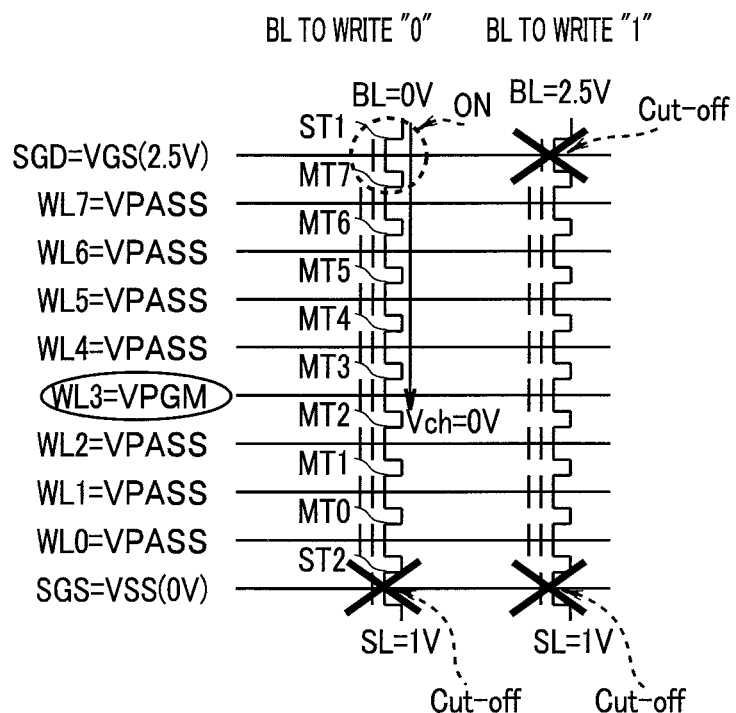
FIG. 8 is a circuit diagram showing states of strings at the time of the write operation.

FIG. 8 is a circuit diagram showing states of strings at the time of the write operation (the program operation).

In FIG. 8, two NAND strings corresponding to a bit line BL targeted by writing "0" and a bit line BL targeted by writing "1" are shown. Further, a state when the word line WL3 is selected is shown.

As shown in FIG. 8, the program voltage VPGM is applied to the selected word line WL3, and the voltage VPASS is applied to the unselected word lines WL0 to WL2, and WL4 to WL7.

Then, in the NAND string corresponding to the bit line BL targeted by writing "0", the select gate transistor ST1 is in an on state. Therefore, a channel potential Vch of the memory cell transistor MT3 connected to the selected word line WL3 becomes 0 V. In other words, a potential difference between the gate and the channel increases; and, as a result, electrons are injected into the charge accumulation film, and the threshold voltage for the memory cell transistor MT3 increases.

In the NAND string corresponding to the bit line BL targeted by writing "1", the select gate transistor ST1 is in a cut-off state. Therefore, the channel of the memory cell transistor MT3 connected to the selected word line WL3 is electrically floating, and the channel potential Vch increases close to the program voltage VPGM by capacitive coupling with the word line WL and the like. In other words, the potential difference between the gate and the channel decreases; and, as a result, electrons are not injected into the charge accumulation film, and the threshold voltage for the memory cell transistor MT3 is maintained (the threshold voltage does not fluctuate so much as the threshold distribution level transitions to a higher distribution).

(Threshold Distribution)

When multi-valued data is written to memory cell transistors MT, the threshold voltages for the memory cell transistors MT are set to values according to values of the data. When the program voltage VPGM and the bit line voltage Vbl_L are applied to the memory cell transistors MT, electrons are injected into the charge accumulating film 336, and the threshold voltages increase. By increasing the program voltage VPGM, the amount of electron injection can be increased, and the threshold voltages for the memory cell transistors MT can be increased. However, even if the same program voltage VPGM is applied, the amount of electron injection differs for each of the memory cell transistors MT because of variation among the memory cell transistors MT. Electrons injected once are maintained until an erase operation is performed. Therefore, the program operation and the verify operation (a loop) are performed several times while the program voltage VPGM is gradually increased, in a manner that a threshold voltage range (hereinafter referred as a target area) allowed as a threshold voltage to be set for each memory cell transistor MT is not exceeded.

Then, by reading the data after the program operation, a verify operation of determining whether the threshold voltages for the memory cell transistors have reached the target area or not. By repeating the combination of the program operation and the verify operation described above, the threshold voltages for the memory cell transistors are increased to the target area. A memory cell transistor the threshold voltage of which is determined to have reached the target area, that is, determined to have exceeded a target level, which is the smallest value of the target area, is write-inhibited afterwards.

Figure 9:
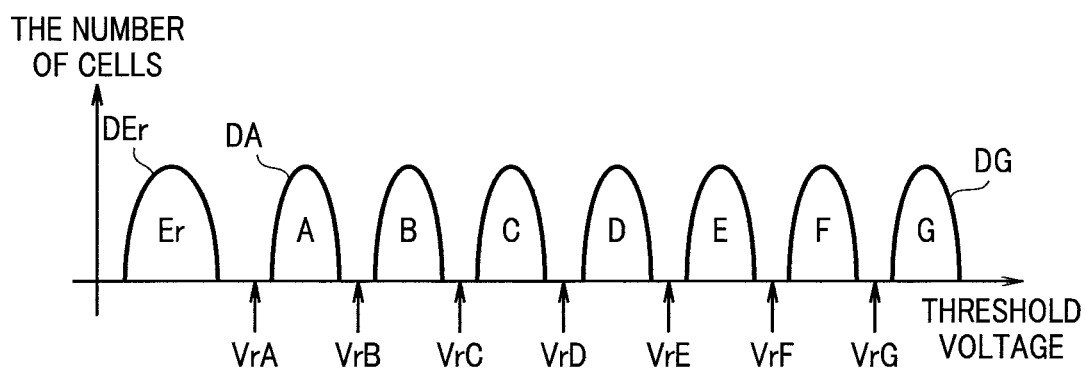
FIG. 9 is a diagram showing threshold distribution of the memory cell array, with threshold voltages being indicated by a horizontal axis and the number of memory cell transistors (the number of cells) being indicated by a vertical axis.

FIG. 9 is a diagram showing threshold distribution of the memory cell array, with threshold voltages being indicated by a horizontal axis and the number of memory cell transistors (the number of cells) being indicated by a vertical axis. In FIG. 9, a threshold distribution example of the 3-bit/cell nonvolatile memory 2 is shown. In the nonvolatile memory 2, the threshold voltage for each memory central resistor MT is set according to each data value of multi-valued data to be stored in the memory cell transistors MT. Since injection of the amount of charge into the charge accumulation film (a charge holding area) is stochastic, the threshold voltages for the respective memory cell transistors MT are statistically distributed as shown in FIG. 9.

FIG. 9 shows the threshold distributions by eight mountain-shaped areas DEr, DA, DB, DC, . . . , DG, and the width of the threshold voltage of each of the areas corresponds to each target area. In the example of FIG. 9, by setting a threshold voltage for a memory cell transistor MT to the inside of any of the eight target areas, it is possible to cause 8-valued data (3-bit data) to be stored into the memory cell transistor MT.

In the present embodiment, a target area where a threshold voltage Vth is equal to or below a voltage VrA in FIG. 9 is called an Er level; a target area where the threshold voltage is higher than the voltage VrA, and equal to or below a voltage VrB is called an A level; a target area where the threshold voltage is higher than the voltage VrB, and equal to or below a voltage VrC is called a B level; and a target area where the threshold voltage is higher than the voltage VrC, and equal to or below a voltage VrD is called a C level. Similarly, D to G levels are set according to the voltages as shown in FIG. 9.

In other words, a level shows which target area according to a data value to be stored into each memory cell transistor MT; and, in the case of 3-bit eight values, target areas are classified as eight levels of the Er, and A to G levels. Note that threshold distributions corresponding to the Er, A, B, F and G levels are called distributions DEr, DA, DB, . . . , DF and DG, respectively. Voltages VrA to VrG are reference voltages to be boundaries among the respective target areas. Note that in the verify operation, the voltages VrA to VrG may be applied to a word line WL as verify levels (voltages) to perform reading so that it may be determined that a threshold voltage corresponding to a level has been reached by a target memory cell transistor MT being turned off.

(Read Operation)

Reading of data from a multi-valued memory cell transistor is performed by applying a read voltage to a selected word line WL by the row decoder 25 and sensing the data read onto a bit line BL by the sense amplifier 24 to determine whether the read data is "0" or "1". Note that in order to cause memory cell transistors connected to unselected word lines WL to be electrically connected, the row decoder 25 gives a sufficiently high voltage VREAD required to turn on each memory cell transistor, to the unselected word lines WL. Note that for adjacent word lines, a voltage VREADK that is slightly higher than the voltage VREAD is given in order to facilitate electrical connection of memory cell transistors connected to the adjacent word lines.

The row decoder 25 applies the read voltage to the selected word line and applies the voltage VREAD or VEREDK to the unselected word lines. At the time of the read operation, the sense amplifier 24 fixes the bit line BL to a predetermined voltage (for example, 0.5 V) and charges a sense node SEN (not shown) in a sense unit 321 to a predetermined precharge voltage Vpre that is higher than the voltage of the bit line BL. In this state, the logic control circuit 21 connects the sense node SEN to the bit line BL. Then, a current flows from the sense node SEN to the bit line BL, and the voltage of the sense node SEN gradually decreases.

The voltage of the sense node SEN changes according to a state of the threshold voltages for memory cell transistors connected to a corresponding bit line BL. In other words, when the threshold voltages for the memory cell transistors are lower than the read voltage, the memory cell transistors are in an on state, and a large cell current flows through the memory cell transistors. The speed of voltage drop of the sense node SEN increases. When the threshold voltages for the memory cell transistors are higher than the read voltage, the memory cell transistors are in an off state, and the cell current that flows through the memory cell transistors is small, or the cell current does not flow through the memory cell transistors. Therefore, the speed of voltage drop of the sense node SEN slows down.

A state of writing to the memory cell transistors is determined with the use of the difference in the speed of voltage drop of the sense node SEN, and a result is stored into a data latch circuit. For example, at a first time point when a predetermined first period has elapsed after discharge start time when discharge of charge of the sense node SEN is started, it is determined whether the voltage of the sense node SEN is at a low level (hereinafter "L") or a high level (hereinafter "H"). For example, when the threshold voltages for the memory cell transistors are lower than the read voltage, the memory cell transistors are completely in an on state, and a large cell current flows through the memory cell transistors. Therefore, the voltage of the sense node SEN rapidly drops. The amount of voltage drop is relatively large, and the sense node SEN reaches "L" at the first time point.

When the threshold voltages for the memory cell transistors are higher than the read voltage, the memory cell transistors are in an off state, the cell current that flows through the memory cell transistors is very small, or the cell current does not flow through the memory cell transistors. Therefore, the voltage of the sense node SEN slowly decreases. The amount of voltage drop is relatively small, and the sense node SEN is kept at "H" at the first time point.

Thus, by a sense amplifier circuit 32 monitoring the state of the sense node SEN while the read voltage is applied to a selected word line by the row decoder 25, it is determined whether the threshold voltages for the memory cell transistors are higher or lower than the read voltage. Therefore, by applying voltages among the respective levels to a selected word line WL as a read voltage, it is possible to determine a level of each memory cell transistor and read data assigned to each level.

For example, by assigning data to each of the eight threshold distributions for a TLC, the TLC is capable of storing 3-bit data per memory cell transistor. Writing is performed for each memory cell transistor at any of the Er, A, B, G levels. At the time of reading, by applying the voltages VrA to VrG, the value of data of each memory cell transistor can be determined.

Figure 10:
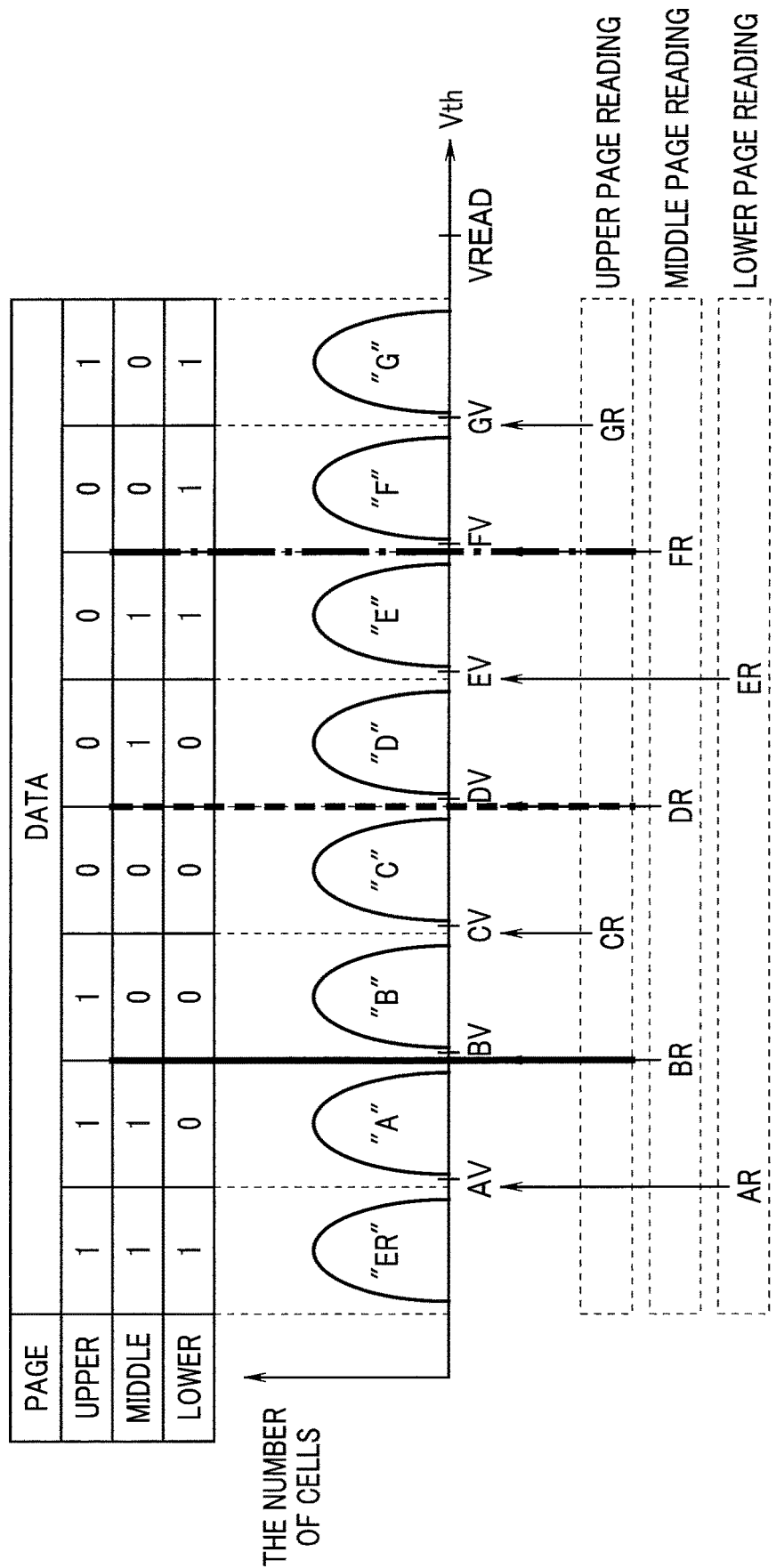
FIG. 10 is an explanatory diagram showing 2-3-2 coding as an example of coding.

As a method for coding for associating a data value with each level (that is, each threshold distribution) for memory cell transistors, various methods can be adopted. FIG. 10 is an explanatory diagram showing 2-3-2 coding as an example of coding. FIG. 10 shows values of an upper bit, a middle bit and a lower bit of data for each threshold distribution.

In the example of FIG. 10, it is shown that a memory cell transistor at the Er level stores data (1, 1, 1); a memory cell transistor at the A level stores data (1, 1, 0); a memory cell transistor at the B level stores data (1, 0, 0); a memory cell transistor at the C level stores data (0, 0, 0); a memory cell transistor at the D level stores data (0, 1, 0); a memory cell transistor at the E level stores data (0, 1, 1); a memory cell transistor at the F level stores data (0, 0, 1); and a memory cell transistor at the G level stores data (1, 0, 1).

Data groups by the upper bit, the middle bit and the lower bit of each memory cell transistor are called an upper page, a middle page and a lower page, respectively. In general, reading is performed for each of the pages.

If it is assumed that not reading per page but reading for determining which of values of three bits the data stored in each memory cell transistor corresponds to, it is necessary to cause a read voltage to be applied to a selected word line WL to change up to seven times from the voltage ΔV to the voltage GV. In comparison, in the case of performing reading per page, the reading can be performed by causing the voltage to change two or three times.

For example, in the case of reading a value of the upper page of each memory cell transistor, the read voltage only has to be caused to change twice at most, to a voltage CV and a voltage FV. For example, in reading, applying the read voltage CV to a selected word line WL, it is possible to, if it is determined by the sense amplifier 24 that a read-target memory cell transistor is in an electrically connected state, determine that the upper page of the read-target memory cell transistor is "1".

Further, for example, in reading, applying the read voltage CV to a selected word line WL, if it is determined by the sense amplifier 24 that a read-target memory cell transistor is in an electrically disconnected state, reading is performed with the read voltage GV next. If it is determined by the sense amplifier 24 as a result that the read-target memory cell transistor is in an electrically connected state, it can be determined that the upper page of the read-target memory cell transistor is "0"; and, if it is determined that the read-target memory cell transistor is in an electrically disconnected state, it can be determined that the upper page of the read-target memory cell transistor is "1".

Thus, in the 2-3-2 coding in FIG. 10, reading is enabled by causing the read voltage to change twice at most for the upper page, three times at most for the middle page, and twice at most for the lower page. Note that for the coding shown in FIG. 10, a gray code in which only 1-bit data changes between two arbitrary adjacent areas is adopted.

(Adjacent Word Line Kick)

As described above, in reading per page, reading is performed while the read voltage VCGRV applied to a selected word line WLn is caused to change. The read voltage VCGRV is supplied to the selected word line WLn from the voltage generation circuit 28 via the row decoder 25. However, a word line WL has a part relatively near to the row decoder 25 (hereinafter referred to as a near end) and a part of the word line WL relatively away from the row decoder 25 (hereinafter referred to as a far end).

FIG. 6C is an explanatory diagram for illustrating the near end and the far end. Note that D1 to D3 directions in FIG. 6C correspond to the D1 to D3 directions in FIG. 4. More specifically, as shown in FIG. 6C, the near end is a part of a word line WL which is relatively near to a contact plug CP for connecting a wire from the row decoder 25 to the word line WL (Near), and the far end is a part of the word line WL which is relatively away from the contact plug CP (Far). At the far end of the word line WL, an RC time constant seen from the row decoder 25 is larger in comparison with the near end of the word line WL. Therefore, on the selected word line WLn, a voltage waveform is different at the near end and at the far end.

FIG. 14A is a waveform diagram showing the above state. At the far end where the RC time constant is large, it takes a relatively long time period for the read voltage VCGRV to transition and reach a desired target level in comparison with the near end.

Therefore, the voltage generation circuit 28 is adapted to, in order to shorten the time period required for the read voltage VCGRV to start transition and then reach the target level (a setup time period), cause a substantially pulsed assist voltage (a kick voltage) at a level exceeding the target level to be generated at a transition timing.

Figure 11:
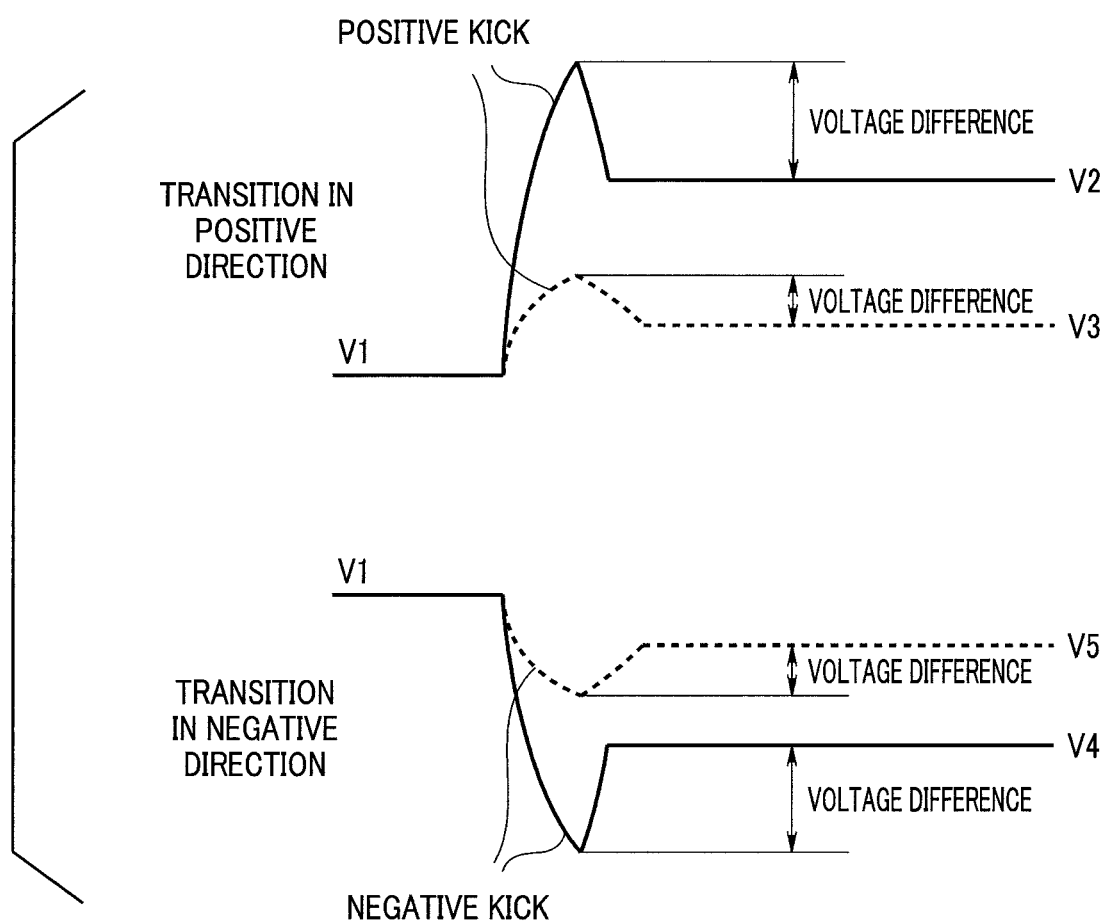
FIG. 11 is a diagram for illustrating kick voltages.

FIG. 11 is a diagram for illustrating the kick voltage. FIG. 11 shows examples of a kick in the case of causing a read voltage V1 to transition to a voltage V2 (a solid line) or V3 (a broken line) in a positive direction and a kick in the case of causing the read voltage V1 to transition to a voltage V4 (a solid line) or V5 (a broken line) in a negative direction. As shown in FIG. 11, in the case of causing the read voltage V1 to transition in the positive direction and change to the target level V2 or V3, a positive kick of applying a kick voltage higher than the target level in the positive direction is performed. In the case of causing the read voltage V1 to transition in the negative direction and change to the target level V4 or V5, a negative kick of applying a kick voltage higher than the target level in the negative direction is performed.

Actually, after an overshot kick voltage drops and reaches a target level, undershoot occurs, though it is not shown in FIG. 11. Therefore, if a kick voltage that is higher than necessary is applied, the undershoot also increases, and, consequently, the setup time period before reaching the target level increases. Therefore, as shown in FIG. 11, for both of the positive kick voltage and the negative kick voltage, a kick voltage with a larger voltage difference between a peak voltage and the target level is applied as the amount of transition of the read voltage is larger, and a kick voltage with a smaller voltage difference between the peak voltage and the target level is applied as the amount of transition of a read voltage is smaller.

Figure 12:
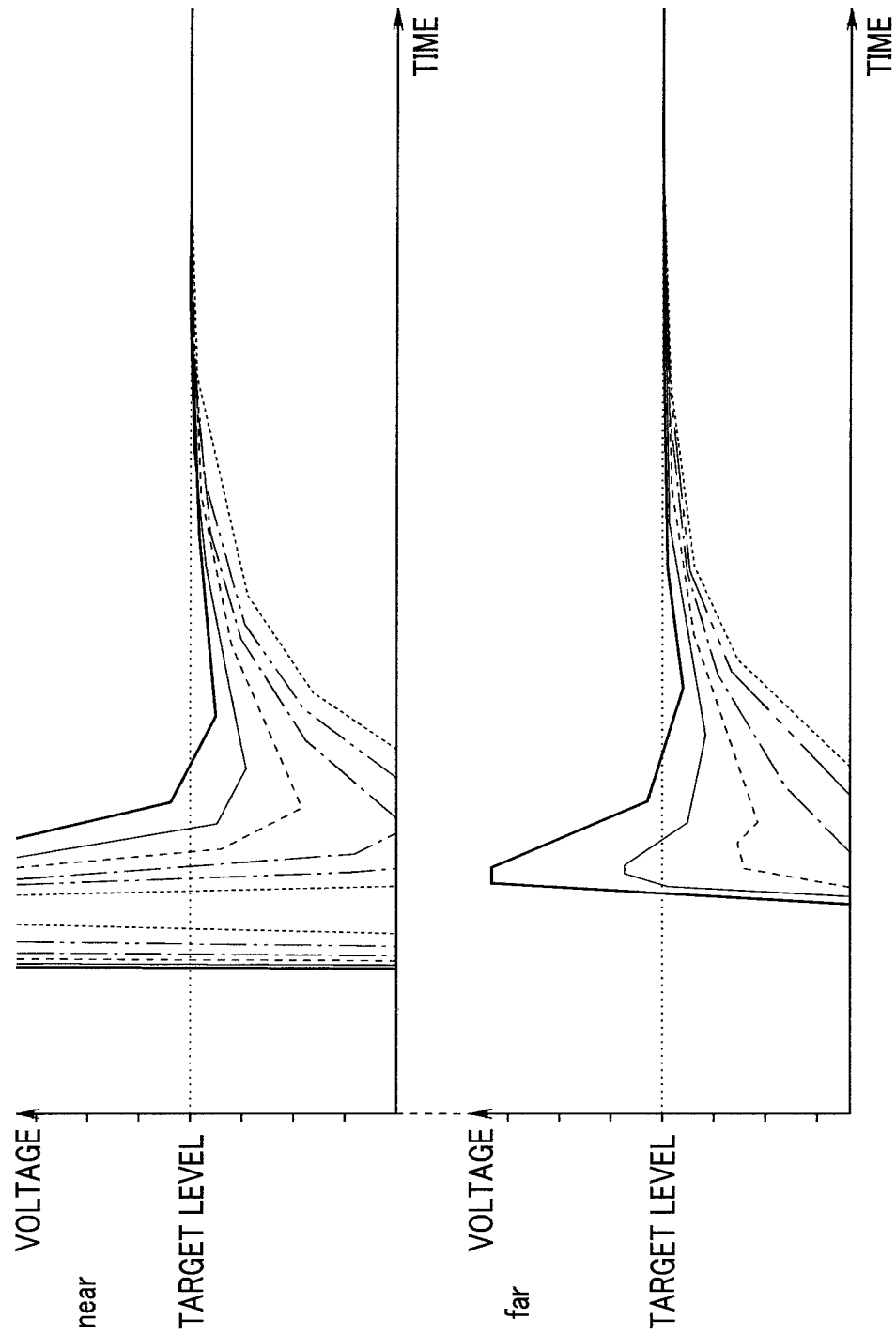
FIG. 12 is a waveform diagram showing voltage waveforms at the near end and the far end on the same selected word line WL due to a positive kick voltage applied when a read voltage VCGRV transitions.

FIG. 12 is a waveform diagram showing voltage waveforms at the near end and the far end on the same selected word line WL caused by a positive kick voltage applied when the read voltage VCGRV transitions, and "near" and "far" show a waveform at the near end and a waveform at the far end, respectively. In FIG. 12, waveforms at six different kinds of kick voltages are indicated by different kinds of lines, and it is shown that peaks of the kick voltages at the near end are beyond a display area of FIG. 12. Note that in the description below, waveforms at the near end and the far end from application of the kick voltages until a target level is reached will be referred to as assist waveforms.

As shown in FIG. 12, at the near end, voltage differences between the kick voltages and the target level are sufficiently large, and assist waveforms akin to a kick voltage waveform outputted by the voltage generation circuit 28 are obtained. On the other hand, at the far end, the kick voltages are delayed and are relatively considerably gradual, and such assist waveforms that voltage differences between the kick voltages and the target level are relatively small are obtained. Consequently, at both of the near end and the far end, time periods required to reach the target level are almost the same.

At the time of reading data from memory cell transistors, the read voltage VCGRV supplied to a selected word line WL is caused to transition, while the fixed voltage VREAD or VREADK is applied to unselected word lines WL. However, due to the influence of coupling between the n-th selected word line WLn and the (n+1)th adjacent word line WLn+1 or the (n−1)th adjacent word line WLn−1, voltages of the adjacent word lines WLn+1 and WLn−1 also fluctuate according to the magnitude of the kick voltage of the read voltage VCGRV. Waveforms during a period of the fluctuation will also be referred to as assist waveforms.

Figure 13:
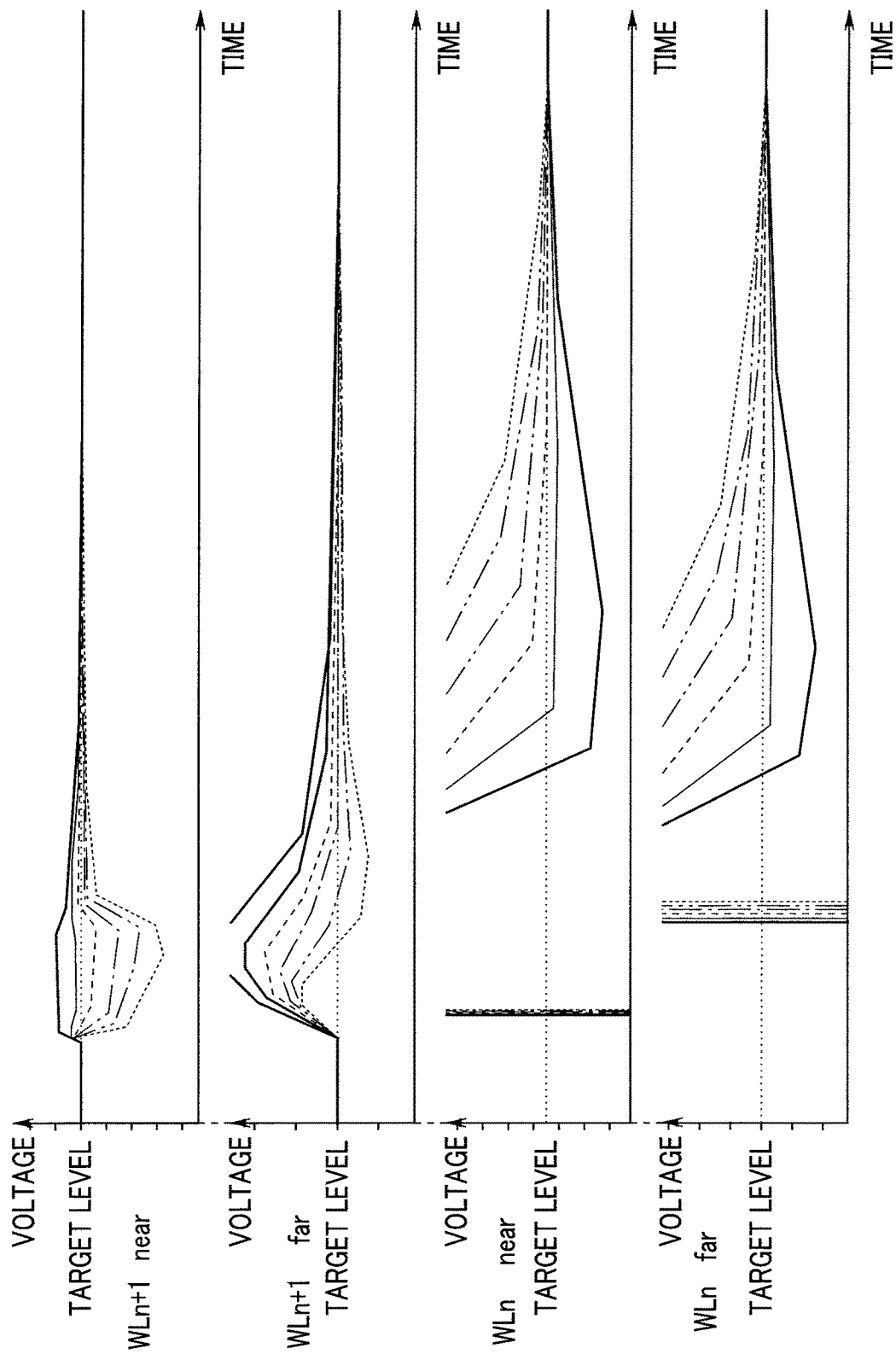
FIG. 13 is a waveform diagram showing voltage waveforms (assist waveforms) on a selected word line WLn and an adjacent word line WLn+1 at the near end and the far end due to the positive kick voltage applied when the read voltage VCGRV transitions.

FIG. 13 is a waveform diagram showing voltage waveforms (assist waveforms) on the selected word line WLn and the adjacent word line WLn+1 at the near end and the far end due to the positive kick voltages applied when the read voltage VCGRV transitions, and "near" and "far" show waveforms at the near end and the far end, respectively. In FIG. 13, waveforms at six different kinds of voltages VREADK are indicated by different kinds of lines. Further, in FIG. 13, in order to show characteristics of the respective assist waveforms, voltage scales of the waveforms are different from each other, and voltages beyond a display area of FIG. 13 are not shown.

Rises of the assist waveforms at the far end (WLn far) of the selected word line WLn are delayed in comparison with rises of the assist waveforms at the near end (WLn near). The kick voltages are relatively considerably gradual at the far end, and, consequently, time periods required to reach the target level are almost the same at both of the near end and the far end.

As for the adjacent word line WLn+1, assist waveforms are also generated at each of the near end and the far end of the adjacent word line WLn+1 due to influence of the kick voltages at the near end and the far end of the selected word line WLn because of coupling with the selected word line WLn.

As described above, the assist waveforms of the selected word line WLn and the adjacent word line WLn+1 have forms of overshooting, undershooting below the target level and then reaching the target level. As for the selected word line WLn, the target level is reached in a relatively short time period as a result of the selected word line WLn being driven by the voltage generation circuit 28. In comparison, as for the adjacent word line WLn+1, the assist waveforms continue for a relatively long time period because the voltages fluctuate due to coupling with the selected word line WLn. Therefore, during a period of returning from the undershoot to the target level on the selected word line WLn, the adjacent word line WLn+1 may be in a state of the level decreasing below the overshoot, though it is not seen in FIG. 13 because of difference in the voltage scale. In this case, due to coupling between the selected word line WLn and the adjacent word line WLn+1, it consequently takes a long time period for the selected word line WLn to return to the target level.

Therefore, in order to shorten the setup time period for the selected word line WLn, adjacent word line kicks that supply kick voltages (adjacent word line kick voltages) with a polarity reverse to the polarity of kick voltages (selected word line kick voltages) supplied to the selected word line WLn to the adjacent word lines WLn±1 are adopted to shorten the period of the assist waveforms generated on the adjacent word lines WLn±1.

However, the amount of transition of the read voltage VCGRV is not necessarily constant. The amount of transition of the read voltage differs according to the kind of coding, settings of the threshold voltages of the respective levels, and the like. Therefore, there is a problem that a time period for the selected word line WL to reach the target level increases.

Figure 14B:
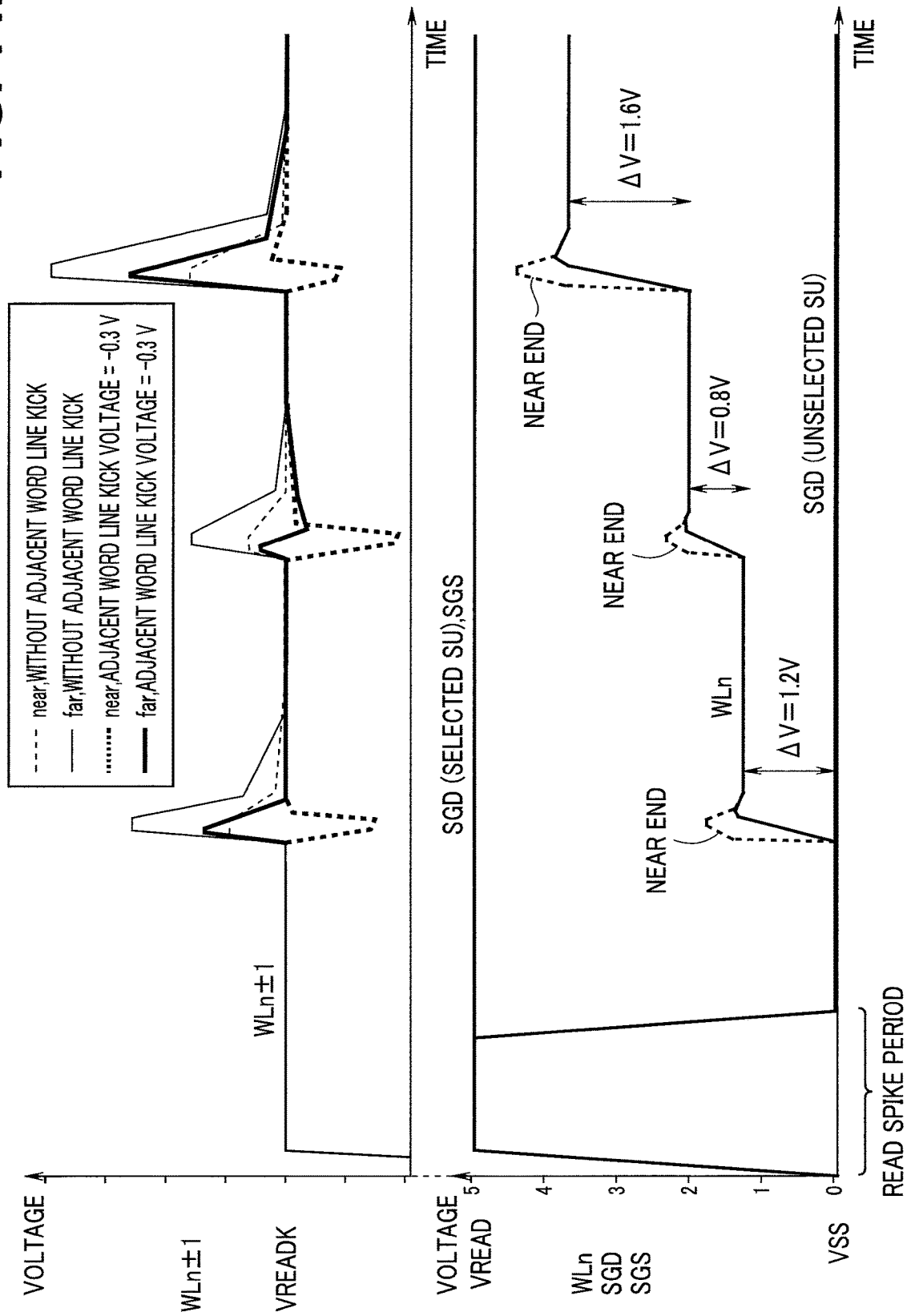
FIG. 14B is a waveform diagram for illustrating a problem.

FIG. 14B is a waveform diagram for illustrating the problem. FIG. 14B shows voltage waveforms of the selected word line WLn and the adjacent word lines WLn±1 at the time of reading data from memory cell transistors for which writing has been performed by adopting predetermined coding.

As methods for reading per page from memory cell transistors, there are, for example, a method of performing reading while sequentially increasing the read voltage VCGRV for each reading (hereinafter referred to as forward read) and a method of performing reading while sequentially decreasing the read voltage VCGRV for each reading (hereinafter referred to as reverse read). The example of FIG. 14B shows change in the read voltage VCGRV in forward read.

First, at the time of starting a series of readings, a read spike period during which a predetermined voltage of, for example, about VREAD (5V) is applied to each of the selected word lines SGS0 to SGS3, and SGD and all the word lines CG0 to CG7.

After the read spike period ends, the read voltage VCGRV is caused to transition in the positive direction to perform reading from memory cell transistors at a predetermined level. The example of FIG. 14B shows an example in which the amount of transition $\Delta V=1.2$ V is satisfied at the time of the first reading among three readings. In this case, the voltage generation circuit 28 generates a kick voltage corresponding to the amount of transition $\Delta V=1.2$ V. As a result, assist waveforms indicated by broken lines are obtained at the near end. Note that assist waveforms are also obtained at the far end.

On the adjacent word lines WLn±1, a predetermined voltage VREADK for turning on memory cell transistors connected to the adjacent word lines WLn±1 is applied. The voltage VREADK fluctuates due to influence of a kick voltage applied to the selected word line WLn. Thin solid lines (the far end) and thin broken lines (the near end) in FIG. 14B show assist waveforms caused by the influence. As described above, by such fluctuation of the adjacent word line WLn±1, the setup time period for the selected word line WLn consequently increases.

Therefore, an adjacent word line kick voltage with a polarity reverse to the polarity of the selected word line kick voltage is applied to the adjacent word line WLn±1. A thick solid line (the far end) and a thick broken line (the near end) in FIG. 14B show an example in which −0.3 V is applied to the adjacent word line WLn±1 as the adjacent word line kick voltage. As a result, at the time of the first reading in FIG. 14B, the voltage VREADK returns to the target level relatively soon at both of the near end and the far end of the adjacent word lines WLn±1. Thereby, the setup time period for the selected word line WLn at the time of the first reading can be consequently shortened.

At the time of the second reading in FIG. 14B, however, the amount of transition $\Delta V$ of the read voltage VCGRV is 0.8 V. Therefore, at the time of the second reading, the influence by the selected word line kick voltage on voltage change of the adjacent word line WLn±1 is smaller than the influence at the time of the first reading. Therefore, the voltage VREADK drops more than necessary (the thick solid line and broken line) due to the adjacent word line kick voltage applied to the adjacent word lines WLn±1 at the time of the second reading, and, consequently, it takes a long time period for the voltage VREADK to return to the target level. Thereby, the setup time period for the selected word line WLn at the time of the second reading becomes relatively long.

At the time of the third reading in FIG. 14B, the amount of transition $\Delta V$ of the read voltage VCGRV is 1.6 V. Therefore, at the time of the third reading, the influence by the selected word line kick voltage on voltage change of the adjacent word line WLn±1 is larger than the influence at the time of the first reading. Therefore, as shown by the thick solid line and broken line, the adjacent word line kick voltage applied to the adjacent word lines WLn±1 at the time of the third reading cannot sufficiently suppress increase in the voltage VREADK, and, consequently, it takes a long time period for the voltage VREADK to return to the target level. Thereby, the setup time period for the selected word line WLn at the time of the third reading becomes relatively long.

(Control of Adjacent Word Line Kick Voltage)

Therefore, in the present embodiment, the amount of kick of an adjacent word line kick is controlled according to the amount of transition of a read voltage. The sequencer 27 is provided with a memory (not shown) configured to hold information about the amount of transition of the read voltage VCGRV at the time of reading and information about the amount of kick of a word line kick (a word line kick voltage) corresponding to the amount of transition. Furthermore, the memory of the sequencer 27 holds information about the amount of kick of the adjacent word line kick (an adjacent word line kick voltage) corresponding to the amount of transition of the read voltage VCGRV. The sequencer 27 controls the voltage generation circuit 28 to cause the word line kick voltage and the adjacent word line kick voltage stored in the memory to be generated when the read voltage VCGRV transitions.

Figure 15:
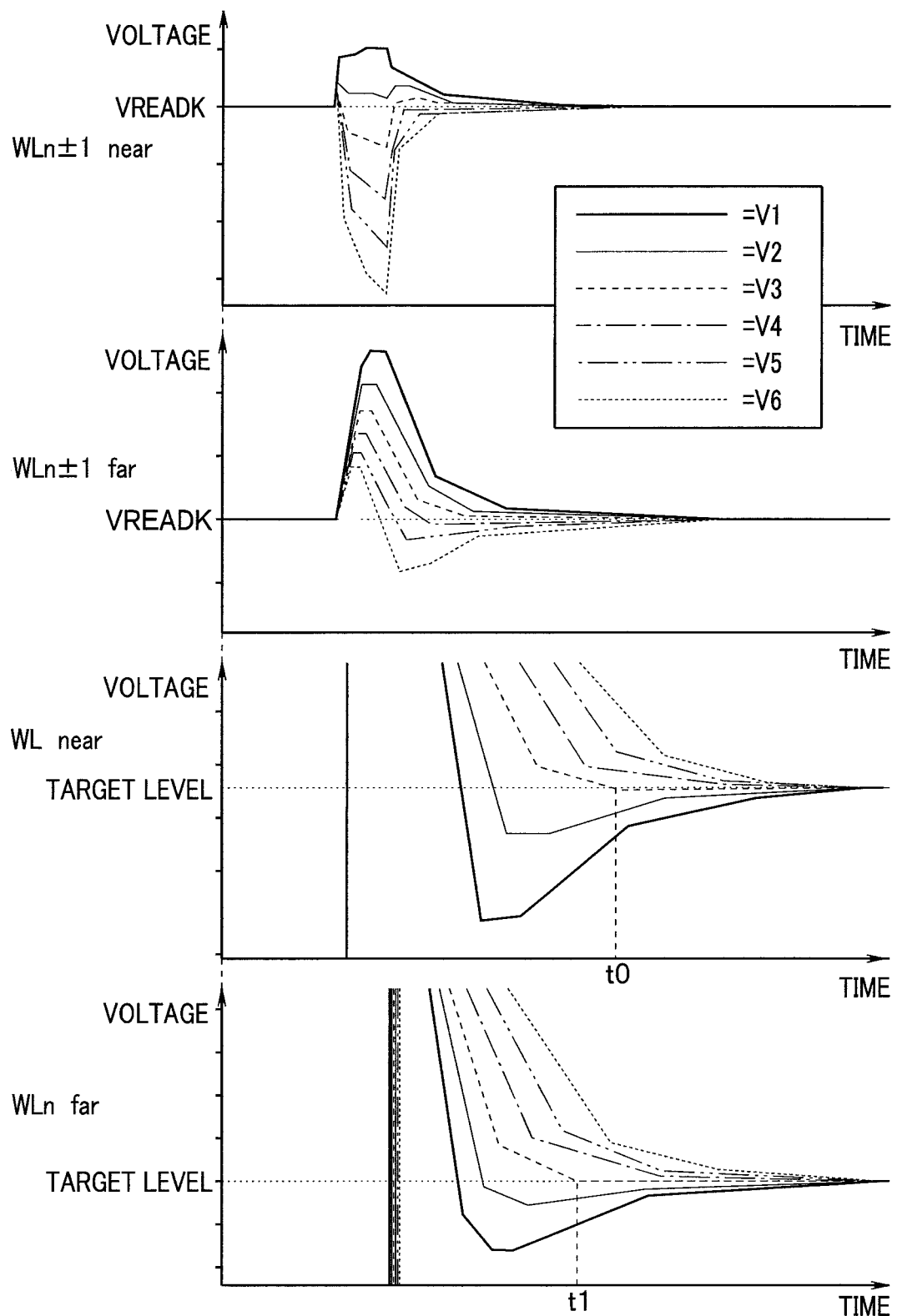
FIG. 15 is a diagram for illustrating an optimum adjacent word line kick voltage.
Figure 16:
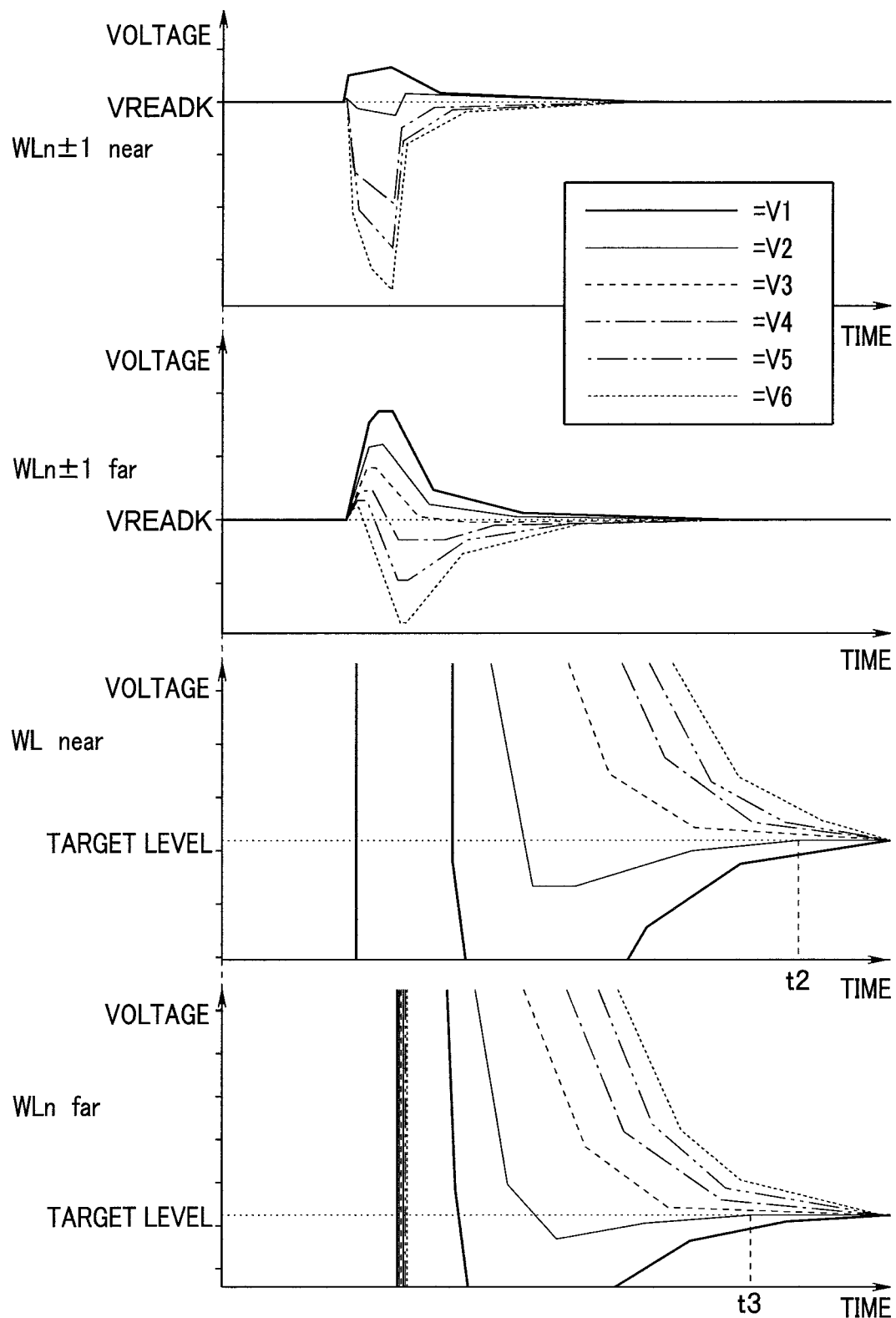
FIG. 16 is a diagram for illustrating an optimum adjacent word line kick voltage.
Figure 17:
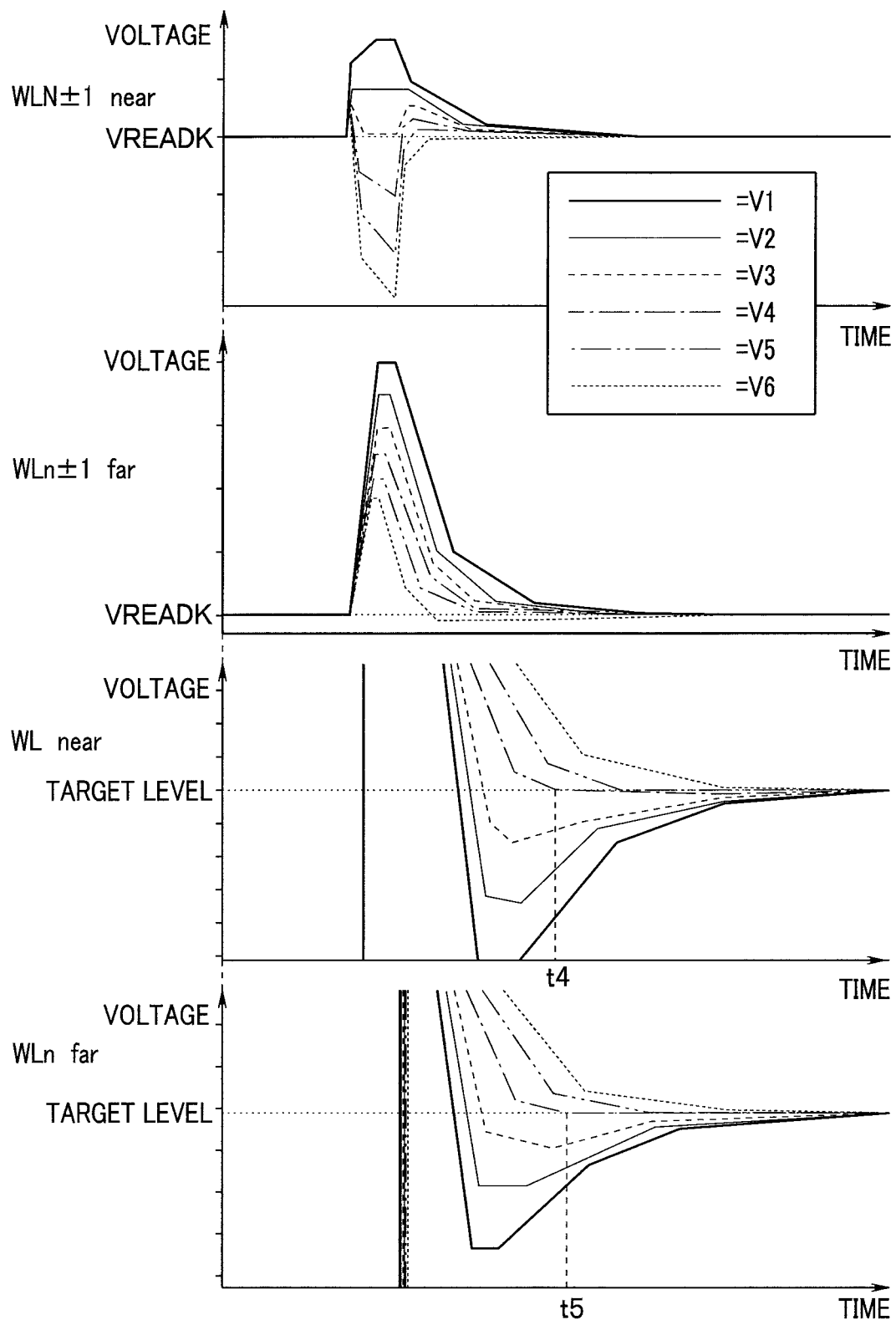
FIG. 17 is a diagram for illustrating an optimum adjacent word line kick voltage.

FIGS. 15 to 17 are diagrams for illustrating an optimum adjacent word line kick voltage at the time of the first, second or third reading in FIG. 14B, respectively, by a representation method similar to FIG. 13. In other words, FIG. 15 shows an example of a case where the amount of transition $\Delta V$ of the read voltage VCGRV in forward read is 1.2 V; FIG. 16 shows an example of a case where the amount of transition $\Delta V$ of the read voltage VCGRV in forward read is 0.8 V; and FIG. 17 shows an example of a case where the amount of transition $\Delta V$ of the read voltage VCGRV in forward read is 1.6 V. FIGS. 15 to 17 show voltage waveforms (assist waveforms) of the selected word line WLn and the adjacent word lines WLn±1 at the near end and the far end at a plurality of kinds of adjacent word line kick voltages. Here, "near" shows waveforms at the near end, and "far" shows waveforms at the far end. In FIGS. 15 to 17, assist waveforms in the case of applying six kinds of different adjacent word line kick voltages V1 to V6 are indicated by different kinds of lines. Further, in FIGS. 15 to 17, voltage scales of the waveforms are also different from each other in order to show characteristics of the respective assist waveforms, and voltages beyond display areas of FIGS. 15 to 17 are also not shown.

In the example of FIG. 15, when the adjacent word line kick voltage V3 is applied to the adjacent word line WLn±1, the target level is reached at time t0 at the near end of the selected word line WLn, and the target level is reached at time t1 at the far end. When the other adjacent word line kick voltages V1, V2, V4 and V5 are applied to the adjacent word line WLn±1, the target level is reached at timings later than the times t0 and t1 on both of the near end and the far end of the selected word line WLn. In other words, it is found that an adjacent word line kick voltage that can shorten, the most, the read voltage VCGRV setup time period for the selected word line WLn is V3. Therefore, in the memory of the sequencer 27, information that specifies the negative kick voltage V3 as the adjacent word line kick voltage is stored if the amount of transition ΔV of the read voltage VCGRV in forward read is 1.2 V.

In the example of FIG. 16, when the adjacent word line kick voltage V2 is applied to the adjacent word line WLn±1, the target level is reached at time t2 at the near end of the selected word line WLn, and the target level is reached at time t3 at the far end. When the other adjacent word line kick voltages V1, V3, V4 and V5 are applied to the adjacent word line WLn±1, the target level is reached at timings later than the times t2 and t3 on both of the near end and the far end of the selected word line WLn. In other words, it is found that an adjacent word line kick voltage that can shorten, the most, the read voltage VCGRV setup time period for the selected word line WLn is V2. Therefore, in the memory of the sequencer 27, information that specifies the negative kick voltage V2 as the adjacent word line kick voltage is stored if the amount of transition ΔV of the read voltage VCGRV in forward read is 0.8 V.

In the example of FIG. 17, when the adjacent word line kick voltage V4 is applied to the adjacent word line WLn±1, the target level is reached at time t4 at the near end of the selected word line WLn, and the target level is reached at time t5 at the far end. When the other adjacent word line kick voltages V1, V2, V3 and V5 are applied to the adjacent word line WLn±1, the target level is reached at timings later than the times t4 and t5 on both of the near end and the far end of the selected word line WLn. In other words, it is found that an adjacent word line kick voltage that can shorten, the most, the read voltage VCGRV setup time period for the selected word line WLn is V4. Therefore, in the memory of the sequencer 27, information that specifies the negative kick voltage V4 as the adjacent word line kick voltage is stored if the amount of transition ΔV of the read voltage VCGRV in forward read is 1.6 V.

Next, an operation of the embodiment configured as above will be described.

Now, it is assumed that reading of data is performed by forward read from memory cell transistors for which writing has been performed by adopting predetermined coding. In the memory (not shown) of the sequencer 27, information about each read voltage VCGRV, the amount of transition of each read voltage VCGRV, a selected word line kick voltage corresponding to the amount of transition, an adjacent word line kick voltage corresponding to the amount of transition, a voltage VREAD and a voltage VREADK in a series of readings by forward read is stored. The sequencer 27 causes the voltage generation circuit 28 to generate a voltage required at the time of reading, based on the information.

In other words, after elapse of a read spike period, the sequencer 27 causes the voltage generation circuit 28 to generate the read voltage VCGRV for the first reading and the selected word line kick voltage corresponding to the amount of transition of the read voltage VCGRV. The voltage generation circuit 28 adds the selected word line kick voltage to the read voltage VCGRV to output the voltage. The row decoder 25 supplies the voltage to a selected word line WLn.

Further, at the time of the first reading in forward read, the sequencer 27 causes the voltage generation circuit 28 to generate the voltages VREAD and VREADK, and the adjacent word line kick voltage (a negative kick voltage) corresponding to the amount of transition of the read voltage VCGRV. The row decoder 25 supplies the voltage VREAD generated by the voltage generation circuit 28 to unselected word lines and supplies a voltage obtained by adding the adjacent word line kick voltage to the voltage VREADK, to adjacent word lines WLn±1.

For example, it is assumed that, as in FIG. 14B, the amount of transition ΔV of the read voltage VCGRV in forward read changes to 1.2 V, 0.8 V and 1.6 V, and reading is performed three times. In this case, the sequencer 27 causes the voltage generation circuit 28 to generate an adjacent word line kick voltage, which is the negative kick voltage V3 in FIG. 15, at the time of the first reading, generate an adjacent word line kick voltage, which is the negative kick voltage V2 in FIG. 16, at the time of the second reading and generate an adjacent word line kick voltage, which is the negative kick voltage V4 in FIG. 17, at the time of the third reading.

Thereby, as shown in FIGS. 15 to 17, the voltage VREADK of the adjacent word lines WLn±1 returns to the target voltage in a relatively short time period in all of the readings. As a result, the read voltage VCGRV of the selected word line WLn also reaches the target voltage in a relatively short time period, and the setup time period is shortened.

Thus, in the present embodiment, in the case of causing a read voltage applied to a selected word line to transition, an adjacent word line kick voltage corresponding to the amount of transition of the read voltage is applied to adjacent word lines when a selected word line kick voltage is added to the read voltage to shorten a setup time period. Thereby, voltage fluctuation of the adjacent word lines is suppressed; the voltage is returned to the original target voltage; and, consequently, the selected word line is caused to reach the target voltage in a short time period. For example, when reading is performed a plurality of times by forward read, a positive kick voltage corresponding to the amount of transition of the read voltage is added to the selected word line, and a negative kick voltage corresponding to the amount of transition of the read voltage is added to the adjacent word lines. Thereby, it becomes possible to shorten the setup time period for the selected word line.

Second Embodiment

Figure 18:
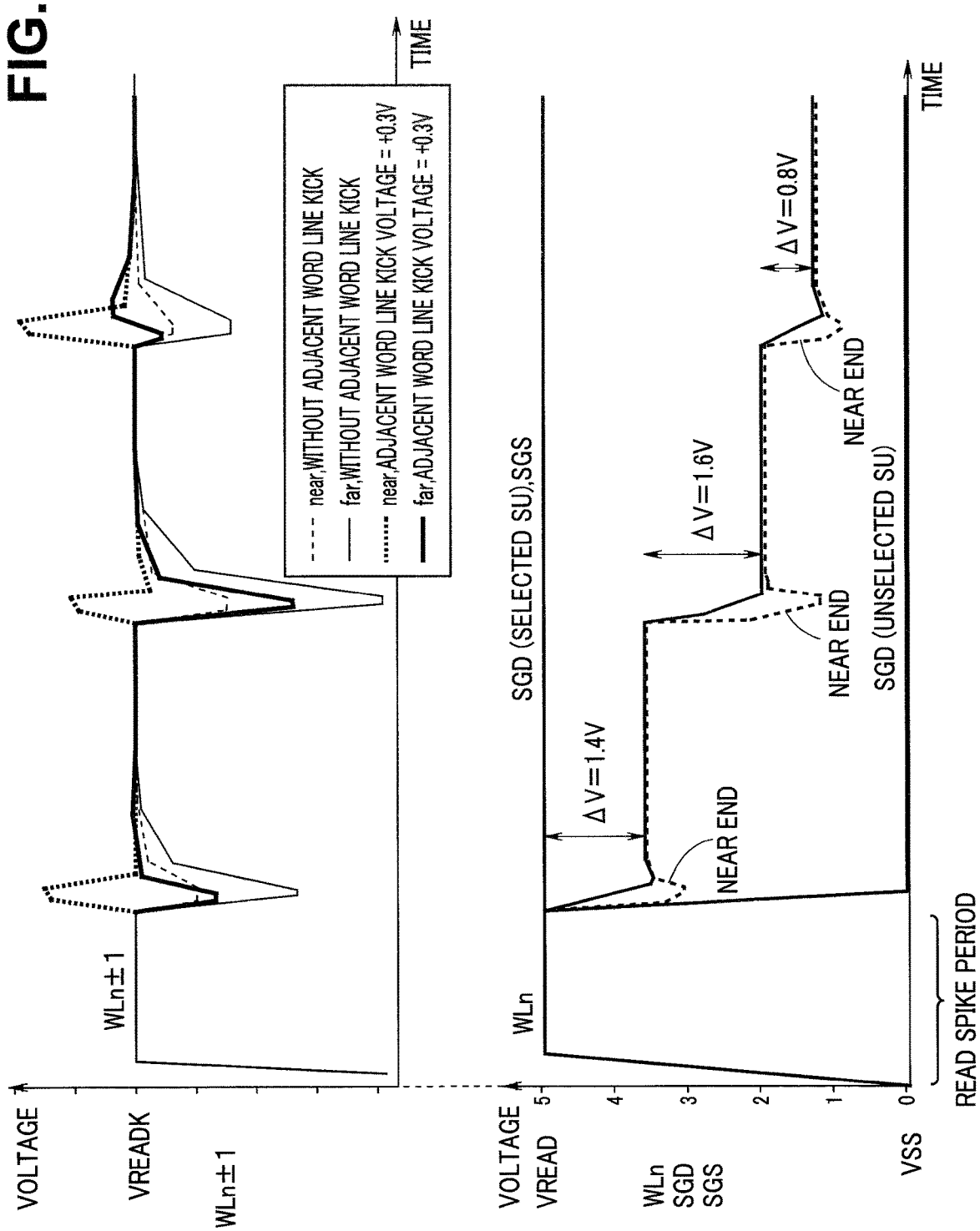
FIG. 18 is a diagram for illustrating a second embodiment of the present invention.

FIG. 18 is a diagram for illustrating a second embodiment of the present invention. The present embodiment describes an example of reverse read, and a hardware configuration is similar to the hardware configuration of the first embodiment.

FIG. 18 shows voltage waveforms of the selected word line WLn and the adjacent word lines WLn±1 in reverse read corresponding to readings in FIG. 14B. In other words, FIG. 18 shows an example of reverse read of, after a read spike period, performing reading while causing a read voltage VCGRV to sequentially drop for each reading in order of the third read voltage, the second read voltage and the first read voltage in FIG. 14B.

In reverse read, after the read spike period ends, the read voltage VCGRV is caused to transition in the negative direction to perform reading from memory cell transistors at a predetermined level. The example of FIG. 18 shows an example in which the amount of transition ΔV=−1.4 V is satisfied at the time of the first reading among three readings. In this case, the voltage generation circuit 28 generates a kick voltage (a negative kick voltage) corresponding to the amount of transition ΔV=−1.4 V. As a result, assist waveforms indicated by broken lines are obtained at the near end. Note that assist waveforms are also obtained at the far end.

On the adjacent word lines WLn±1, a predetermined voltage VREADK for turning on memory cell transistors connected to the adjacent word lines WLn±1 is applied. The voltage VREADK fluctuates due to influence of a kick voltage applied to the selected word line WLn. Thin solid lines (the far end) and thin broken lines (the near end) in FIG. 18 show assist waveforms caused by the influence. As shown by the assist waveforms, it takes a relatively long period to return to the target voltage at both of the far end and the near end. When such fluctuation occurs on the adjacent word line WLn±1, the setup time period for the selected word line WLn consequently increases.

Therefore, an adjacent word line kick voltage (a positive kick voltage) with a polarity reverse to the polarity of the selected word line kick voltage (a negative kick voltage) is applied to the adjacent word line WLn±1. A thick solid line (the far end) and a thick broken line (the near end) in FIG. 18 show an example in which +0.3 V is applied to the adjacent word line WLn±1 as the adjacent word line kick voltage. As a result, at the time of the first reading in FIG. 18, the voltage VREADK returns to the target level relatively soon at both of the near end and the far end of the adjacent word lines WLn±1. Thereby, the setup time period for the selected word line WLn at the time of the first reading can be consequently shortened.

At the time of the second reading in FIG. 18, however, the amount of transition ΔV of the read voltage VCGRV is −1.6 V. Therefore, at the time of the second reading, the influence by the selected word line kick voltage on voltage change of the adjacent word line WLn±1 is larger than the influence at the time of the first reading. Therefore, the adjacent word line kick voltage of +0.3 V applied to the adjacent word lines WLn±1 at the time of the second reading cannot sufficiently suppress drop of the voltage VREADK, and, consequently, it takes a long time period for the voltage VREADK to return to the target level. Thereby, the setup time period for the selected word line WLn at the time of the second reading becomes relatively long.

At the time of the third reading in FIG. 18, the amount of transition ΔV of the read voltage VCGRV is −0.8 V. Therefore, at the time of the third reading, the influence by the selected word line kick voltage on voltage change of the adjacent word line WLn±1 is smaller than the influence at the time of the first reading. Therefore, the voltage VREADK increases higher than necessary due to the adjacent word line kick voltage of +0.3 V applied to the adjacent word lines WLn±1 at the time of the third reading, and, consequently, it takes a long time period for the voltage VREADK to return to the target level. Thereby, the setup time period for the selected word line WLn at the time of the third reading becomes relatively long.

Therefore, in the present embodiment, a positive kick voltage applied to adjacent word lines is also controlled according to the amount of transition of a read voltage. In other words, a higher voltage is set as the positive kick voltage as the amount of transition of the read voltage is larger, and a lower voltage is set as the positive kick voltage as the amount of transition of the read voltage is smaller. Note that information about the positive kick voltage in this case is also stored into the memory (not shown) of the sequencer 27, which is similar to the first embodiment.

In the embodiment configured as described above, read control similar to the read control of the first embodiment is also performed.

For example, it is assumed that, as in FIG. 18, the amount of transition ΔV of the read voltage VCGRV in reverse read changes to −1.4 V, −1.6 V and −0.8 V, and reading is performed three times. In this case, the sequencer 27 causes the voltage generation circuit 28 to generate a middle-level positive kick voltage corresponding to the amount of transition of −1.4 V at the time of the first reading, generate a high positive kick voltage corresponding to the amount of transition of −1.6 V at the time of the second reading and generate a low positive kick voltage corresponding to the amount of transition of −0.8 V at the time of the third reading.

Thereby, the voltage VREADK of the adjacent word lines WLn±1 returns to the target voltage in a relatively short time period in all of the readings. As a result, the read voltage VCGRV of the selected word line WLn also reaches the target voltage in a relatively short time period, and the setup time period is shortened.

Thus, in the present embodiment, effects similar to the effects of the first embodiment can also be obtained.

Note that though an example of deciding an adjacent word line kick voltage according to the amount of transition of the read voltage VCGRV has been described in each of the above embodiments, the adjacent word line kick voltage may be decided based on the amount of transition of the read voltage VCGRV and the amount of kick.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor storage device comprising:
a memory cell array including a plurality of series-connected memory cell transistors each of which can be set to any of threshold voltages at a plurality of voltage levels;
a plurality of word lines connected to gates of the plurality of memory cell transistors, respectively;
a voltage generation circuit configured to generate,
a read voltage to be supplied to a selected word line to which a read-target memory cell transistor is connected among the plurality of word lines, the read voltage including at least two voltage levels of the plurality of voltage levels corresponding respectively to the threshold voltages, and
a first read-pass voltage to be supplied to an adjacent word line adjacent to the selected word line, the first read-pass voltage being higher than any of the at least two voltage levels of the read voltage:
a word line driver configured to, when reading data from the read-target memory cell among the plurality of memory cell transistors,
apply the read voltage to the selected word line for the at least two voltage levels; and
apply the first read-pass voltage to the adjacent word line,
such that, when the read voltage transitions among the at least two voltage levels, the read voltage is applied to the selected word line with a first kick voltage, and the first read-pass voltage is applied to the adjacent word line with a second kick voltage; and a control circuit configured to set the first kick voltage and the second kick voltage for the at least two voltage levels of the read voltage.

2. The semiconductor storage device according to claim 1, wherein
the read voltage transitions between the at least two voltage levels in a positive direction;
the first kick voltage is a positive voltage with respect to the read voltage; and
the second kick voltage is a negative voltage with respect to the first read-pass voltage.

3. The semiconductor storage device according to claim 1, wherein
the read voltage transitions between the at least two voltage levels in a negative direction;
the first kick voltage is a negative voltage with respect to the read voltage; and
the second kick voltage is a positive voltage with respect to the first read-pass voltage.

4. The semiconductor storage device according to claim 1, wherein
the read voltage change between the voltage levels in a positive direction plural times.

5. The semiconductor storage device according to claim 1, wherein
the read voltage change between the voltage levels in a negative direction plural times.

6. The semiconductor storage device according to claim 1, wherein
the word lines extend in a first direction,
the word line driver is coupled to the word lines at one end portions located at one side of the word lines in the first direction such that one end portions being near ends and the other end portions located at the other side of the word lines in the first direction being far ends,
the first kick voltage is set to a voltage value to shorten a time period until the read voltage reaches a target voltage level at both the near end of the selected word line and the far end of the selected word line; and
the second kick voltage is set to a voltage value to shorten a time period until the first read-pass voltage reaches a target voltage level at both the near end of the adjacent word line and the far end of the adjacent word line.

7. The semiconductor storage device according to claim 6, wherein
the word line driver is not coupled to the other end portions of the word lines.

8. The semiconductor storage device according to claim 7, wherein
each of the plurality of word lines has a planar shape extending in the first direction and a second direction crossing the first direction,
the plurality of word lines are laminated in a third direction crossing the first and second directions,
the adjacent word line includes,
a word line above the selected word line, and
a word line below the selected word line.

9. The semiconductor storage device according to claim 8, wherein
the voltage generation circuit is further configured to generate,
a second read-pass voltage to be supplied to remaining word lines other than the selected word line and the adjacent word line, the second read-pass voltage being higher than any of the at least two voltage levels of the read voltage and lower than the first read-pass voltage, and
the word line driver is further configured to,
apply the second read-pass voltage to the remaining word lines such that, when the read voltage transitions among the at least two voltage levels, the second read-pass voltage is applied to the remaining word lines without a kick voltage.

* * * * *